(12) United States Patent
Krylov et al.

(10) Patent No.: US 10,827,152 B2
(45) Date of Patent: Nov. 3, 2020

(54) TUNABLE MEMS ETALON

(71) Applicant: TECHNOLOGY INNOVATION MOMENTUM FUND (ISRAEL) LIMITED PARTNERSHIP, Tel-Aviv (IL)

(72) Inventors: Viacheslav Krylov, Holon (IL); Ariel Raz, Givataim (IL); David Mendlovic, Tel Aviv (IL)

(73) Assignee: TECHNOLOGY INNOVATION MOMENTUM FUND (ISRAEL) LIMITED PARTNERSHIP, Tel Aviv (IL)

( * ) Notice: Subject to any disclaimer, the term of this patent is extended or adjusted under 35 U.S.C. 154(b) by 0 days.

(21) Appl. No.: 15/741,311

(22) PCT Filed: Jul. 14, 2016

(86) PCT No.: PCT/IL2016/050772
§ 371 (c)(1),
(2) Date: Jan. 2, 2018

(87) PCT Pub. No.: WO2017/009850
PCT Pub. Date: Jan. 19, 2017

(65) Prior Publication Data
US 2018/0205915 A1 Jul. 19, 2018

Related U.S. Application Data

(60) Provisional application No. 62/192,658, filed on Jul. 15, 2015.

(51) Int. Cl.
*B81B 3/00* (2006.01)
*H04N 9/04* (2006.01)
(Continued)

(52) U.S. Cl.
CPC .......... *H04N 9/045* (2013.01); *B81B 3/0056* (2013.01); *B81C 1/00507* (2013.01);
(Continued)

(58) Field of Classification Search
CPC ... B81B 3/0056; B81B 2201/042; B81B 7/00; B81B 7/0041; B81B 7/02; B81B 3/00;
(Continued)

(56) References Cited

U.S. PATENT DOCUMENTS 6,424,466 B1  7/2002  Flanders
6,594,059 B2  7/2003  Flanders
(Continued)

FOREIGN PATENT DOCUMENTS

CN  1875638 A  12/2006
CN  102053361  5/2011
(Continued)

OTHER PUBLICATIONS

ISR of PCT/IL2016/050827 dated Nov. 8, 2016.
(Continued)

*Primary Examiner* — Chuong A Luu
(74) *Attorney, Agent, or Firm* — Kenealy Vaidya LLP

(57) ABSTRACT

Disclosed herein is a novel a tunable Micro-Electro-Mechanical (MEMS) Etalon system including: a functional layer patterned to define a suspension structure for suspending a first mirror being an aperture mirror of the Etalon, an aperture mirror coupled to the suspension structure, and a back layer including a second mirror, being a back mirror of the Etalon. The functional layer may be located above the back layer and the back layer may include spacer structures protruding therefrom towards the aperture mirror to define a minimal gap between the aperture mirror and the back mirror and prevent collision between them. The aspect ratio between the width of the etalon/mirrors may be high (e.g. at (Continued)

least 500), and the minimal gap/distance between the mirrors may be small in the order of tens of nanometers (nm). Accordingly, in some implementations the parallelism between the aperture mirror and the back mirror is adjustable to avoid chromatic artifacts associated with spatial variations in the spectral transmission profile across the etalon.

28 Claims, 27 Drawing Sheets

(51) Int. Cl.
G02B 26/00 (2006.01)
B81C 1/00 (2006.01)
(52) U.S. Cl.
CPC ...... *G02B 26/001* (2013.01); *B81B 2201/042* (2013.01); *B81C 2201/0114* (2013.01)
(58) Field of Classification Search
CPC ....... B81B 3/001; B81B 7/007; B81B 7/0038; B81B 2203/0127; B81B 2203/0315; B81B 2201/0235; B81B 2201/0242; B81B 2203/0118; B81B 2201/025; B81B 2203/04; B81C 1/0507; B81C 1/00; B81C 1/00293; B81C 1/00182; B81C 1/00238; B81C 1/00285; B81C 2201/0114; B81C 2201/013; B81C 2201/0132; B81C 2203/035; B81C 2203/0118; H01L 2924/1461
USPC ...................................................... 257/682
See application file for complete search history.

(56) References Cited

U.S. PATENT DOCUMENTS

| 6,961,182 | B2 | 11/2005 | Murata |
| 7,177,505 | B2 | 2/2007 | Willcox |
| 7,420,738 | B2 | 9/2008 | Verghese |
| 7,554,667 | B1 | 6/2009 | Kampe |
| 7,564,612 | B2 | 7/2009 | Chui |
| 7,733,553 | B2 | 6/2010 | Aase et al. |
| 7,760,197 | B2 | 7/2010 | Faase et al. |
| 7,936,056 | B2 | 5/2011 | Hatakeyama |
| 8,039,816 | B2 | 10/2011 | Morishita et al. |
| 8,164,757 | B2 | 4/2012 | Yamanoi |
| 8,378,434 | B2 | 2/2013 | Krylov et al. |
| 8,384,905 | B2 | 2/2013 | Wu |
| 8,848,197 | B2 | 9/2014 | Pruessner et al. |
| 2002/0044575 | A1 | 4/2002 | May |
| 2003/0011864 | A1 | 1/2003 | Flanders |
| 2005/0027166 | A1 | 2/2005 | Matsumoto et al. |
| 2005/0029437 | A1 | 2/2005 | Hasegawa et al. |
| 2005/0030545 | A1 | 2/2005 | Tuschel |
| 2007/0116078 | A1 | 5/2007 | Kim |
| 2007/0153866 | A1 | 7/2007 | Shchegrov et al. |
| 2008/0144001 | A1 | 6/2008 | Heeg |
| 2009/0236525 | A1 | 9/2009 | Mitra et al. |
| 2010/0135537 | A1 | 6/2010 | Ye et al. |
| 2011/0208462 | A1 | 8/2011 | Maier |
| 2012/0008141 | A1 | 1/2012 | Matsushita |
| 2012/0188646 | A1 | 7/2012 | Sano et al. |
| 2012/0200682 | A1 | 8/2012 | Mestha et al. |
| 2014/0069232 | A1 | 3/2014 | Elata et al. |
| 2014/0092282 | A1 | 4/2014 | Morishita |
| 2014/0165724 | A1 | 6/2014 | Krylov et al. |
| 2015/0153563 | A1* | 6/2015 | Kamal ............... H01S 3/08027 372/20 |
| 2015/0298322 | A1 | 10/2015 | Morris et al. |
| 2016/0171653 | A1 | 6/2016 | Mendlovic et al. |

FOREIGN PATENT DOCUMENTS

| CN | 102148999 A | 8/2011 |
| CN | 102466516 A | 5/2012 |
| CN | 102741671 A | 10/2012 |
| CN | 103048781 | 4/2013 |
| EP | 0693683 A1 | 1/1996 |
| JP | 2000162043 A | 6/2000 |
| JP | 2005024825 A | 1/2005 |
| JP | 2008125934 A | 6/2008 |
| JP | 2009033222 A | 2/2009 |
| JP | 2013224995 A | 10/2013 |
| WO | 200128224 A2 | 4/2001 |
| WO | 2005046248 A1 | 5/2005 |
| WO | 2011064403 A1 | 6/2011 |
| WO | WO2014207742 A2 | 12/2014 |
| WO | WO2017009850 A1 | 1/2017 |

OTHER PUBLICATIONS

ISR of PCT/IL2016/050772 dated Oct. 9, 2016.
A. Ya'akobovitz, S. Krylov, Influence of Perforation on Electrostatic and Damping Forces in Thick SOI MEMS Structures, J. Micromech. Microeng. 22, pap. 115006, 2012.
C. G. Agudelo, M. Packirisamy, G. Zhu, L. Saydy, "Nonlinear control of an electrostatic micromirror beyond pull-in with experimental validation," J. MEMS 18, 914-923 (2009).
J. Wei "Wafer Bonding Techniques for Microsystem Packaging," Journal of Physics: Conference Series 34 (2006) 943-948.
S. Krylov and Y. Bernstein, "Large Displacement Parallel Plate Electrostatic Actuator with Saturation Type Characteristic," Sensors and Actuators A-Physical, 130-131, 497-512, 2006.
S. Rabanim, E. Amir, S. Krylov, "Bistable Threshold Sensor With Mechanically Nonlinear Self-Limiting Suspension and Electrostatic Actuation," Proc. of the ASME 2011 International Design Engineering Technical Conferences & Computers and Information in Engineering Conference IDETC/CIE 2011 Aug. 28-31, 2011, Washington, DC, USA.
A. Ya'akobovitz, S. Krylov, and Y. Hanein, "A MEMS Nano-extensometer with Integrated De-amplification Mechanism," Microsystem Technologies, 17(3) pp. 337-345, 2011.
N. M. Elman, S. Krylov , M. Sternheim , Y. Shacham-Diamand, "Multiple Aspect-Ratio Structural Integration in Single Crystal Silicon (MASIS) for fabrication of Transmissive MOEMS Modulators," Microsystem Technologies, 14 (2), 287-293, 2008.
T. Shmilovich and S. Krylov, "Single Layer Tilting Actuator with Multiple Close-Gap Electrodes," Journal of Micromechanics and Microengineering, 19(8), paper 085001, 2009.
Y. Gerson, S. Krylov and B. Ilic, "Electrothermal Bistability Tuning in a Large Displacement Micro Actuator," Journal of Micromechanics and Microengineering, 20, paper 112001, 2010.
A. Engel and R. Friedrichs, "On the electromagnetic force on a polarizable body," Am. J. Phys. 70, 428-432, 2002.
H. Raeder, F. Tyholdt, W. Booij, F. Calame, N. P. Østbø, R. Bredesen, K. Prume, G. Rijnders, P. Muralt, Taking piezoelectric microsystems from the laboratory to production, J. Electroceram., 19, 2007, 357-362.
S. Schmid, C. Hierold, and A. Boisen, "Modeling the Kelvin polarization force actuation of micro- and nanomechanical systems," Journal of Applied Physics 107, 054510, 2010.
Baglio, S., et al. "Optical SOI micro-gravimeters with bulk PZT excitation." Sensors, 2004 IEEE. IEEE, 2004. (abstract only).
Zavracky, Paul M., et al. "Micromachined scanning Fabry-Perot interferometer." Micromachined Devices and Components IV. vol. 3514. International Society for Optics and Photonics, 1998.

\* cited by examiner

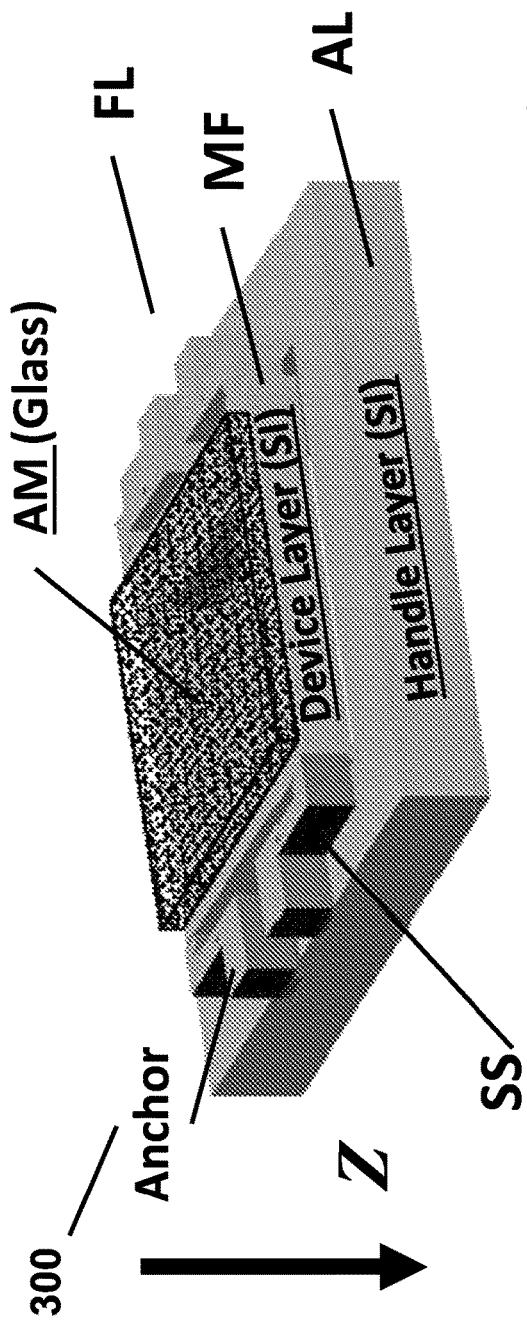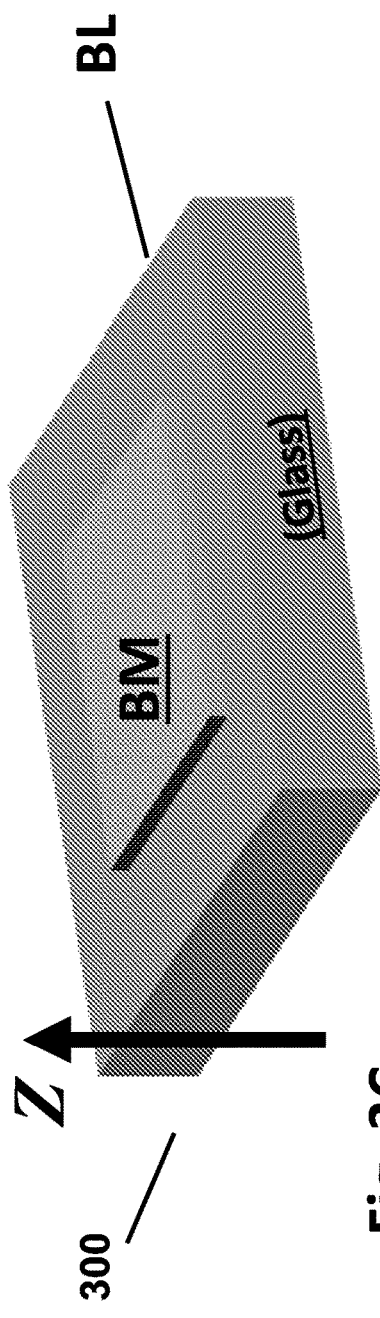
Fig. 3B
Fig. 3C

SOI Fabrication Process
MEMS layer (a) SOI wafer (b) Metal lift-off, device layer DRIE (c) Handle DRIE (d) Release

Aperture Mirror Fabrication (e) Semi-transparent mirror temporarily attached to a carrier (f) Glass patterning/machining (or off the shelf processed glass)

Back Layer and Back mirror Fabrication (g) Starting material – glass wafer (h) Reflective layer ("mirror") lift-off (Ti oxide $TiO_2$)

(i) Spacers deposition and patterning (j) Mirror/spacers protection, cavity etch in the substrate, solder deposition Substrate processing (f) Starting material – glass wafer (g) Reflective layer ("back mirror") $TiO_2$ (h) Spacers deposition and patterning Substrate processing (d) Starting material – glass wafer (e) Reflective layer ("back mirror") TiO$_2$ (f) Spacers deposition and patterning (g) Glass-to-glass spacer bonding

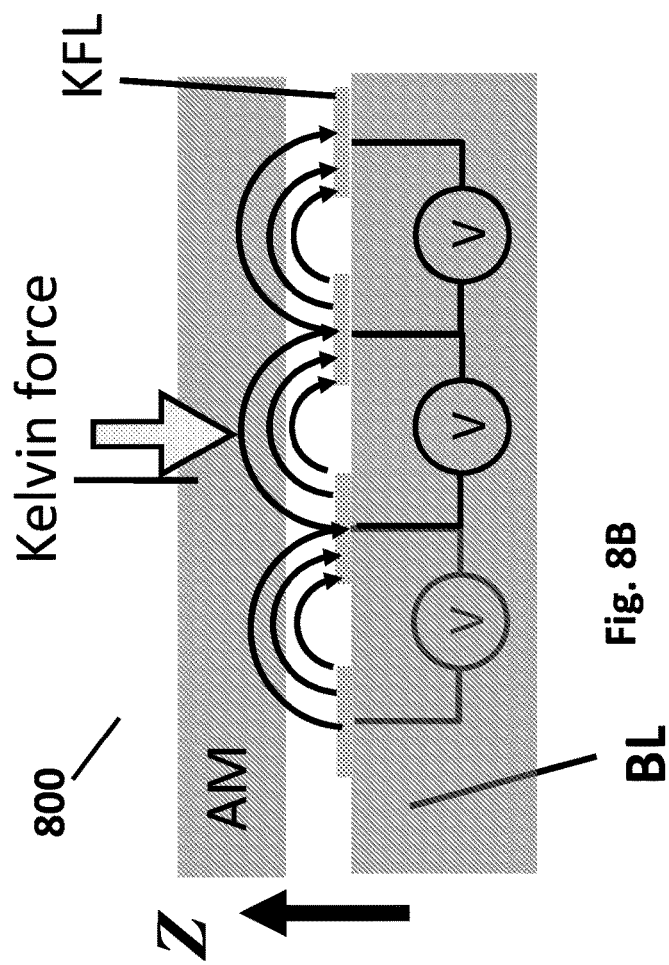
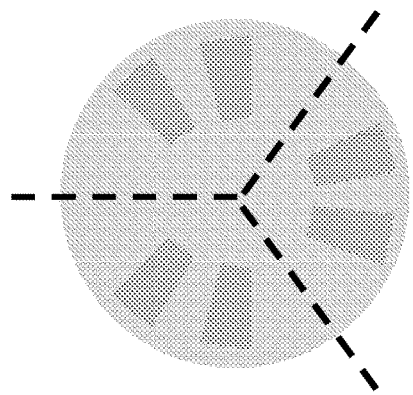
Fig. 8B
Fig. 8C
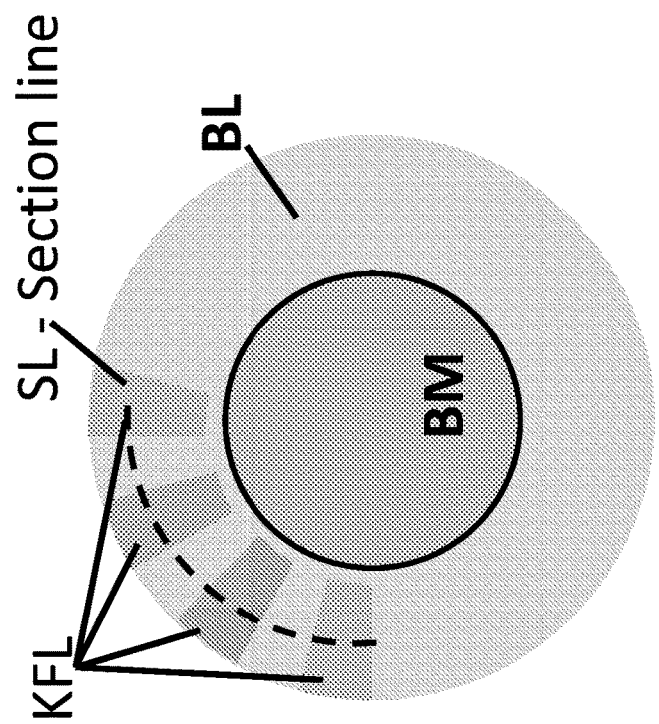
Fig. 8A

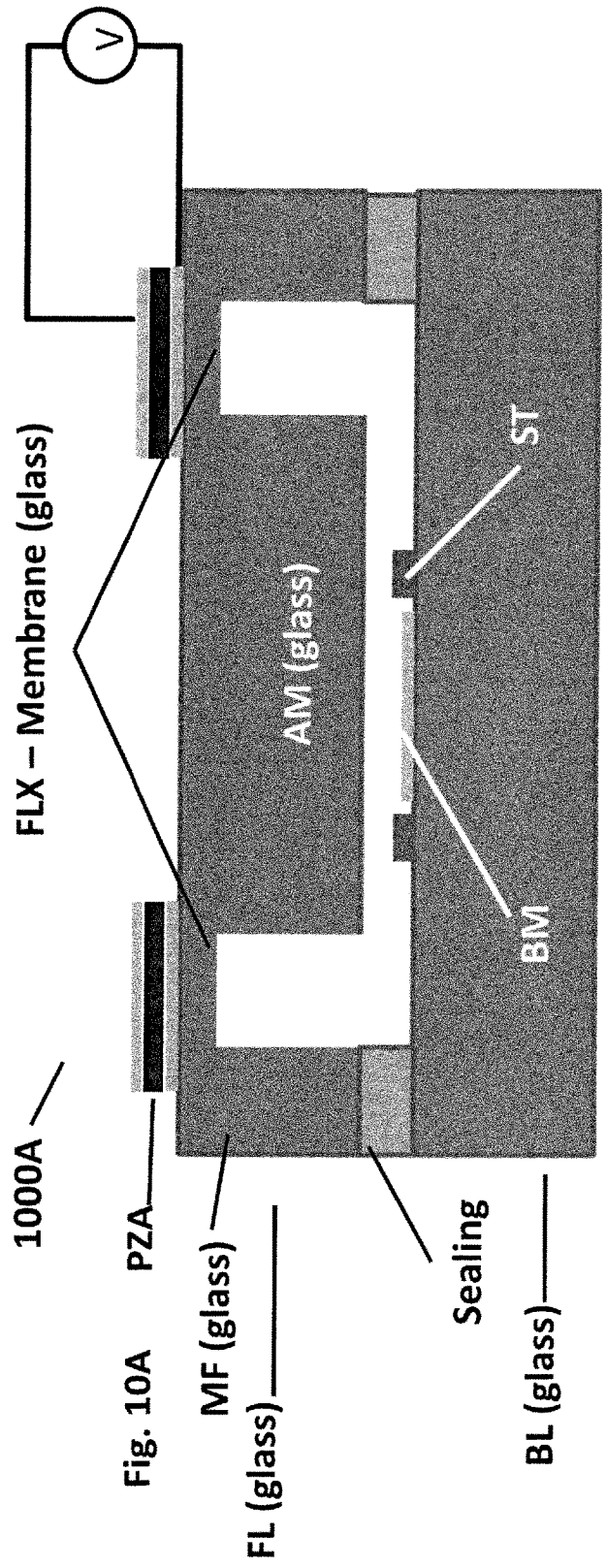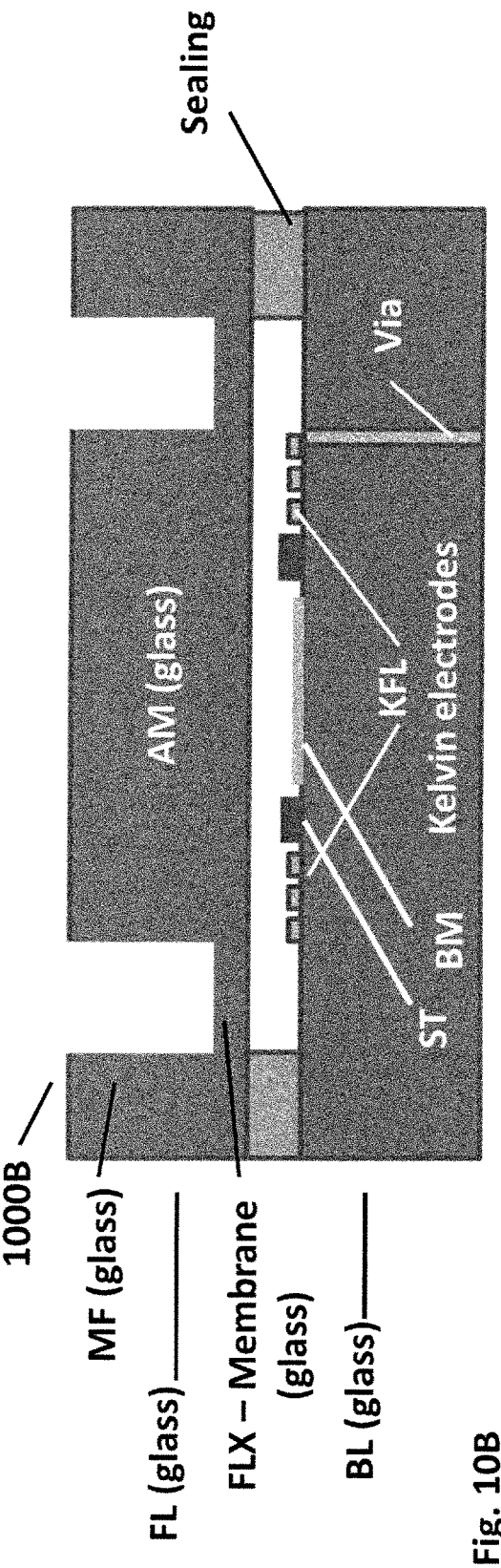
Fig. 10A
Fig. 10B

TUNABLE MEMS ETALON

TECHNOLOGICAL FIELD

The invention is in the field of Micro-Electro-Mechanical systems (MEMS) more specifically provides novel configurations and fabrication techniques for tunable MEMS based spectral filters.

BACKGROUND ART

References considered to be relevant as background to the presently disclosed subject matter are listed below:
[1] A. Ya'akobovitz, S. Krylov, "Influence of Perforation on Electrostatic and Damping Forces in Thick SOI MEMS Structures," *J. Micromech. Microeng.* 22, pap. 115006, 2012.
[2] C. G. Agudelo, M. Packirisamy, G. Zhu, L. Saydy, "Nonlinear control of an electrostatic micromirror beyond pull-in with experimental validation," *J. MEMS* 18, 914-923, 2009.
[3] J. Wei "Wafer Bonding Techniques for Microsystem Packaging," *Journal of Physics: Conference Series* 34 (2006) 943-948
[4] A. Engel and R. Friedrichs, "On the electromagnetic force on a polarizable body," *Am. J. Phys.* 70, 428-432, 2002.
[5] S. Schmid, C. Hierold, and A. Boisen, "Modeling the Kelvin polarization force actuation of micro- and nanomechanical systems," *Journal of Applied Physics* 107, 054510, 2010.
[6] H. Ræder, F. Tyholdt, W. Booij, F. Calame, N. P. Østbø, R. Bredesen, K. Prume, G. Rijnders, P. Muralt, Taking piezoelectric microsystems from the laboratory to production, J. Electroceram., 19, 2007, 357-362.

Acknowledgement of the above references herein is not to be inferred as meaning that these are in any way relevant to the patentability of the presently disclosed subject matter.

BACKGROUND

Sequential imaging is a promising emerging field of color imaging which allows capturing colorful images with improved color fidelity and/or with hyper spectral color information.

An example of sequential imaging technique is described of example in WO 2014/207742, co assigned to the assignee of the present application.

In general, sequential imaging utilizes a tunable spectral filter placed along a line of sight of a multi pixel image sensor. The image sensor is operated to acquire a series of images in a short time sequence while the spectral transmission of the tunable spectral filter is varied. Accordingly the images of the series each correspond to a different color content of the captured scene which corresponds to the state/profile of spectral transmission of the filter which was set when each image was taken.

For the tunable spectral filter, an etalon may be used. An etalon is a tunable spectral filter, which is comprised of two parallel mirrors. The spectral transmission profile is determined by the gap between the mirrors; thus, tuning the applied voltage tunes the gap between the mirrors and, in turn, tunes the spectral transmission profile. Typically etalon filters incorporate two semi-transparent elements: e.g. an aperture mirror and a back mirror. The back mirror may be, for example, stationary while the aperture mirror may be movable toward/away from the back mirror in order to change the distance (optical cavity between them), and thereby tuning the spectral transmission of the etalon.

General Description

Etalons are widely used in optical communication to filter, modulate and/or control the properties of optical signals, such as laser light beams, transmitted along the optical communication channels. Yet when considering optical communication, often the filter is required to operate accurately and efficiently in only a limited spectral band (e.g. of several nanometers), and is not required to provide specific/wide transmission profiles as in many cases required for sequential spectral imaging applications (see WO 2014/207742).

On the other hand, in sequential spectral imaging applications, such as regular (e.g. RGB) color image acquisition and/or high spectral imaging, not only is the etalon often required to have a wide spectral transmission profile and wide free spectral range (which may impose a short distance between the etalon mirrors), but also it may be required to be laterally wide enough so as to cover the entire field of view of the image sensor in front of which it is positioned.

As a consequence, tunable etalons for use in sequential spectral color imaging have often very high aspect ratio between their width and the distance between their mirrors, and also the distance between their mirrors should be adjustable to variable to very close proximity between them (e.g. a few tens of nanometers).

The above considerations make conventional etalons, such as those used for optical communication, less suitable for sequential spectral image acquisition. This is because of the typically narrow spectral transmission profile of the conventional etalons, and their small free spectral range. On the other hand, the conventional etalon configurations are less suitable for making tunable etalons, having the relatively wide spectral transmission profiles and large free spectral ranges as those needed for imaging applications. This is because the conventional configurations are less suited for etalons having such short spacing between the etalon mirrors (e.g. in the order of tens of nanometers and such relatively large lateral width of the mirrors (e.g. in the order of millimeters). In fact the conventional configurations for tunable etalons are more suited for fabrication of etalons having limited spectral band tunability—due to their limited ability to place the mirrors in close proximity—and/or for fabrication of etalons having a relatively small aspect ratio between mirror width to mirror spacing or it may otherwise result in significant chromatic aberrations (changes in the chroma transmission along the lateral direction of the etalon) due to the un-parallel setting of the etalon mirror.

Indeed, the general principles of etalon operation are well known. However, there are several limiting factors of the conventional etalon configurations which inhibit their use for sequential spectral imaging applications. One such limiting factor relates to the tuning range and resolution of the gap between the etalon mirrors, which is limited in the conventional tunable etalon configurations. As will be further described below, this issue is solved in certain embodiments of the present invention by providing the novel actuation configurations. Another limiting factor of the conventional etalon configurations is that high end actuators used in such etalons (actuation mechanism; feedback mechanism) are costly and not suitable for mass production. The etalon of the present invention is, however, MEMS-based and can be produced in mass production with relatively low costs.

A key challenge is the manufacturing variations that will be expressed in distorted transmission spectrum. Thus, embodiments of the tunable etalon MEMS devices of the present invention where developed based on an opto-mechanical model which estimates reasonable manufacturing tolerances, quantify the spectral distortion and calibrate the acquired signal accordingly.

According to a broad aspect of the present invention there is provided a tunable Micro-Electro-Mechanical (MEMS) Etalon system including:

A functional layer patterned to define a suspension structure (e.g. in the form of a spring or a thin membrane for suspending a first mirror, being an aperture mirror of the Etalon;

An aperture mirror coupled to the suspension structure; and

A back layer including a second mirror, being a back mirror of the Etalon.

The functional layer with the aperture mirror coupled thereto is located above the back layer and the back layer may include spacer structures protruding therefrom towards the aperture mirror to define a minimal gap between the aperture mirror and the back mirror and prevent collision between them.

In some embodiments the aspect ratio between the width of the etalon/mirrors and the minimal gap/distance between them is at least 500. The gap/distance between the mirrors may be tuned by using electrostatic actuation, piezo-electric actuation and/or Kelvin force actuation. The minimal gap distance between the mirrors may be small in the order of tens of nanometers (nm). Consequently, as a result from the high aspect ratio small minimal gap, in some embodiments of the invention parallelism between said aperture mirror and the back mirror should be adjustable to avoid chromatic artifacts associated with spatial variations in the spectral transmission profile across the etalon.

Thus, in some embodiments the displacement between the aperture mirror and the back mirror adjustable by means of electrostatic forces. The etalon system further includes an actuation layer located above the functional layer such that one or more regions of the actuation layer are electrically insulated from the functional layer. The displacement between said aperture mirror and the back mirror is adjustable by applying electric potential difference between the one or more regions of the actuation layer and the functional layer to cause said electrostatic forces between them. In some embodiments the one or more regions of the actuation layer actually include two or more regions that are substantially electrically insulated from one another. Accordingly, application of different electric potentials between the two or more regions (e.g. typically three or more regions) of the actuation layer and the functional layer allows adjusting the parallelism between the aperture mirror and said back mirror.

Alternatively or additionally, in some embodiments the etalon system includes Kelvin electrodes that are located and arrange on a surface of the back layer. Accordingly, applying voltage to these electrodes causes Kelvin polarization force between the aperture mirror and the back layer or between the aperture mirror and the actuation layer located at the side of the aperture opposite to the back layer. The arrangement of Kelvin electrodes may be configured such that it enables adjusting the distance/gap and the parallelism between the aperture mirror and the back mirror of the etalon. To increase the Kelvin polarization force, the aperture mirror may include or be coupled to high k dielectric material.

Yet alternatively or additionally, in some embodiments the etalon system includes Piezoelectric actuation structure that is coupled to the suspension structure such that application of electric voltage through the piezoelectric actuation structure deforms the suspension structure thereby adjusting a distance between the aperture mirror that is suspended thereby and the back mirror of the etalon. By placing several Piezoelectric actuation structure on different parts/flexures/springs of the suspension structure, the parallelism between the aperture mirror and the back mirror of the etalon can be controlled.

In some embodiments of the present invention the functional layer of the tunable MEMS Etalon system is fabricated from Silicon on Insulator (SOI) wafer structure. For example the functional layer may be insulated from the actuation layer of the etalon by the box layer of the SOI wafer.

In embodiments in which electrostatic actuation is used, the displacement/gap and parallelism between the aperture mirror and the back mirror may be adjusted by applying electric potential difference between two or more regions of the actuation layer, which are substantially electrically insulated from one another by tranches patterned in said handle layer of the SOI wafer structure, and the functional layer to thereby cause said electrostatic forces between them.

In some embodiments the tunable MEMS Etalon system is fabricated by Glass-on-Silicon technique. The functional layer is fabricated from the SOI wafer structure by patterning the layer of the SOI; and the actuation layer includes a glass substrate having a cavity formed at a location above the aperture mirror.

In some embodiments of the present invention the tunable MEMS Etalon system is configured as a full glass structure. The functional layer includes a glass substrate that is pattered to accommodate/define the suspension structure carrying the aperture mirror. The back layer includes a second glass substrate attached to the glass substrate of the functional layer. The functional layer may be patterned to define a peripheral frame region which is coupled to said second glass substrate by air tight sealing.

In some embodiments the glass functional layer is in the form of a continuous layer patterned to have a thin membrane region enclosed within the peripheral frame region. The thin membrane enclosing an aperture region defining the aperture mirror. The thin membrane is configured as flexure of suspending the aperture mirror. Also the thin membrane enclosing an aperture region may be sealed (to air/moisture) thus and sealing a space enclosing the aperture mirror between the functional layer and the back layer.

Alternatively or additionally, the glass functional layer may include bending beam spring flexure coupling the peripheral frame region, and the aperture mirror, said bending beam spring flexure may include at least one of the following:

(a) Pattered region of the glass substrate of said functional layer shaped to form said spring flexure; and (b) Pre-stressed polyimide coupled to said peripheral frame region.

According to another aspect of the present invention there is provided an imaging system including: an image sensor including a plurality of light sensitive pixels; and a tunable MEMS Etalon system configured according to the present invention placed along an optical path of light propagation towards the image sensor.

In some embodiments the width of the aperture mirror and the back mirror of the tunable MEMS Etalon system is large enough so that they interpose in the optical path to all the pixels of the sensor. Also, a minimal distance of a tunable gap distance between the mirrors is small enough to provide FWHM and FSM transmission profile properties of the tunable MEMS Etalon system suitable for carrying out sequential color imaging of three or more colors in the visual spectral regime.

In some embodiments the tunable MEMS Etalon system is configured and operable for being tuned to pass towards the image sensor, light with spectral content corresponding to colors of a conventional RGB space.

In the following, the operational principles, architecture and fabrication process of a Micro-Electro-Mechanical (MEMS) Etalon system/device, which can be integrated/used with the imaging system (e.g. sequential spectral imaging system and/or hyper spectral imaging system), is described.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 3A to 3C show a tunable MEMS Etalon system/device according to an embodiment of the invention in which the actuation and functional layers are fabricated by Silicon-on-Insulator (SOI) technique.

FIGS. 8A to 8C show schematically a tunable MEMS etalon device/system according to an embodiment of the present invention in which the aperture mirror is actuated by Kelvin force;

FIGS. 10A to 10F show schematically in self explanatory manner sealed tunable MEMS etalon devices made of glass and method of fabricating the same according to two embodiments of the present invention;

DETAILED DESCRIPTION OF EMBODIMENTS

Figure 1:
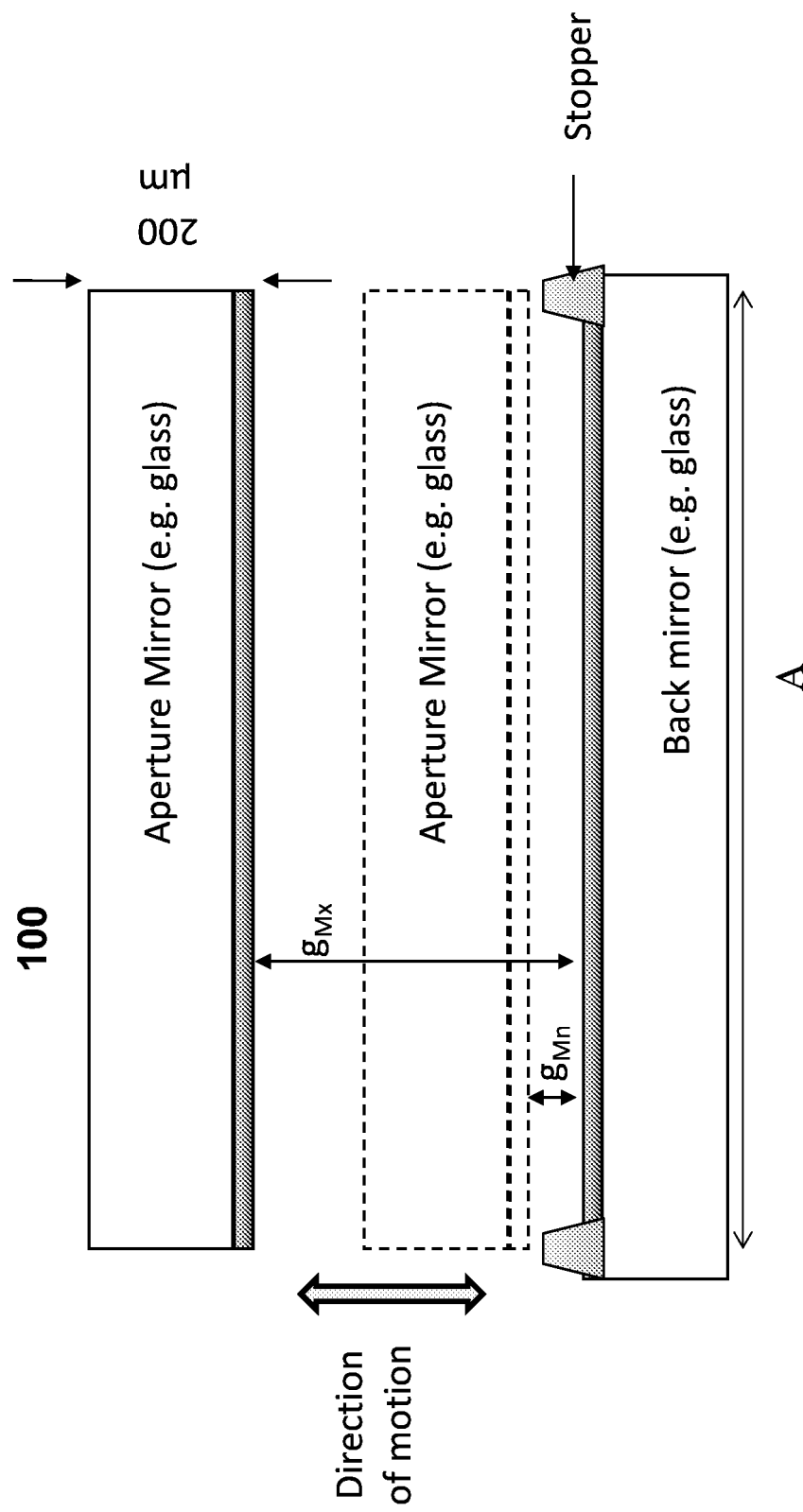
FIG. 1 shows a tunable etalon device 100 including two substantially parallel mirrors/reflective-surfaces.

FIG. 1 illustrates in self-explanatory manner tunable etalon device 100 including two substantially parallel mirrors/reflective-surfaces, which are respectively referred to herein as: aperture mirror AM and back mirror BM. The mirrors are movable with respect to one another so that a gap distance g between them can be tuned between certain minimal and maximal gap distance, $g_{Mn}$ and $g_{Mx}$.

In certain embodiments of the present invention the minimal gap distance $g_{Mn}$ between the mirrors is defined by stoppers which prevent the contact between the mirrors which can cause damage thereto.

The MEMS etalon system/device of the invention may be configured with transmission properties suitable for imaging applications. To this end the MEMS etalon system/device of the invention may be configured as a wide dynamic filter tunable over a wide spectral band (e.g. extending from the infra-red [IR]; e.g. from the near-IR, NIR) in the long wavelength side of the spectrum, and to the violet and/or ultra-violet (UV) at the short wavelength side of the spectrum. Also, the MEMS etalon system/device of the invention may be configured to have wide spectral transmission profile (e.g. full width half maximum (FWHM) of the spectral transmission profile in the order of 60-120 nm which is suitable for picture grabbing/imaging applications), and also have relatively large free spectral range between successive peaks in the order of or larger than 30 nm thereby providing good color separation.

To achieve the desired transmission properties (spectral transmission band, FWHM and FSR) suitable for imaging applications, the MEMS etalon of the invention is configured such that the aperture mirror can travel to distance range between $g_{Mn}$ to $g_{Mx}$ from the back mirror, wherein the minimal gap distance $g_{Mn}$ can be in the order of a few tens of nanometers (nm) or less, and the maximal gap distance $g_{Mx}$ between them may be up to 2 microns (e.g., typical value of order of $g_{Mx}$~300 to 400 nm) being greater than the minimal gap $g_{Mn}$ by an order of magnitude. As will be further described below, in various embodiments of the present invention different actuation configurations are used supportive of the small minimal gap $g_{Mn}$ required between the mirrors and/or the large ratio $g_{Mx}/g_{Mn}$ between the maximal and minimal gap distances.

The degrees of reflectivity/transparency of the aperture mirror and the back mirror are selected in accordance with the desired spectral transmission properties of the etalon and are typically semi-reflective to some degree. In some embodiments of the present invention the back mirror and possibly also the aperture mirror includes Titanium Oxide layer deposited on a glass layer/substrate. In certain embodiments of the invention the back mirror is stationary and the aperture mirror is designed to be movable towards and/or away the back mirror so as to change the gap between them and thereby tune the spectral transmission band profile of the etalon.

It should be noted that in certain embodiments of the invention, particularly when imaging application are concerned, the lateral dimension/width A of the mirrors BM and AM should be large enough (e.g. in the order of several hundreds of micrometers to several millimeters) to allow light passage to a relatively wide multi-pixel image sensors. On the other hand, the minimal gap $g_{Mn}$ between the mirrors should be small enough (e.g. tens of nm) to allow desired spectral transmission properties of the etalon. This results in a large aspect ratio of the optical cavity between the mirrors (e.g. between the lateral width A and the minimal gap distance $g_{Mn}$), which in turn requires that accurate angular alignment is maintained between the mirrors to prevent/reduce spatial distortion of the chromatic spatial transmission band of the etalon along the width/lateral spatial directions thereof. To this end, various embodiments of the present invention, described for example with reference to FIGS. 5a-5c and 8A-9C described below, use various actuation techniques and fabrication techniques, (electrostatic and/or other techniques, which allow to accurately setting the angular alignment between the mirrors AM and BM.

To this end, according to certain broad aspects of the invention provided a MEMS Etalon system/device, which includes:

A functional layer defining a suspension structure for suspending a first mirror, being an aperture mirror of the etalon;

An aperture mirror coupled to the suspension structure; and

A back layer comprising a second mirror, being a back mirror of the etalon.

The MEMS Etalon system/device also includes MEMS actuation mechanism which is coupled/attached to an aperture mirror. The MEMS actuator provides an ability to displace the aperture mirror in a controllable way and change the gap distance (and accordingly the optical cavity) between the aperture mirror and the back mirror, therefore providing tunable spectral filtering functionality of the etalon device.

In the present invention several architectures and actuation paradigms of the device are disclosed. A common feature in all the embodiments below is that the aperture mirror is attached to a MEMS actuation assembly. The use of MEMS actuators allows low-cost mass fabrication of the system and makes it suitable for the implementation in consumer electronics devices.

Figure 2A:
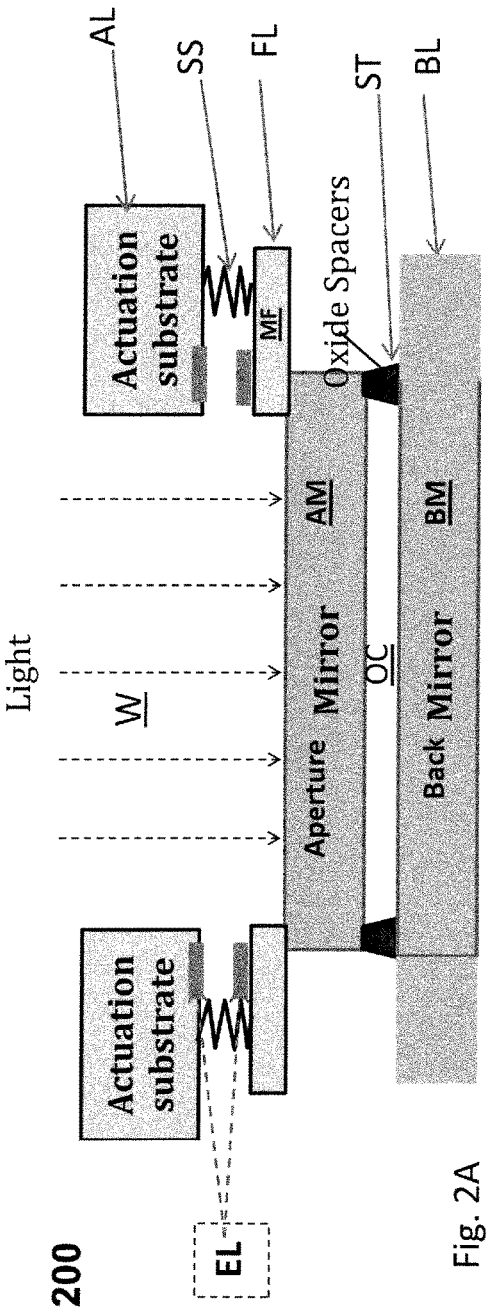
FIGS. 2A and 2B illustrate schematically an electrostatically actuated tunable etalon MEMS device according to an embodiment of the present invention.
Figure 2B:
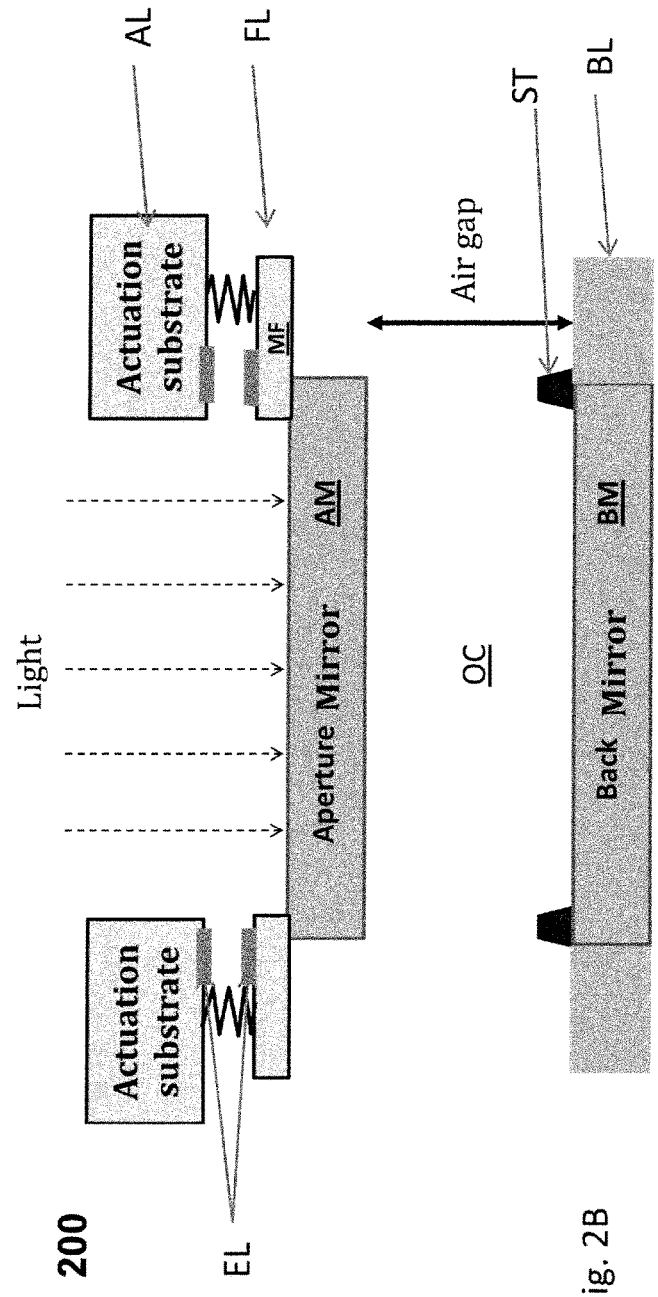

FIGS. 2A and 2B illustrate schematically, in self-explanatory manner, an electrostatically actuated tunable etalon MEMS device 200 according to an embodiment of the present invention. The tunable etalon MEMS device 200 of this embodiment is operable by a close gap electrode (parallel electrode plates). The device includes an actuation layer/substrate AL, a functional layer FL which defines a suspension structure SS for suspending a mounting ring/frame MF to which the aperture mirror AM is attached, and a back layer BL comprising the back mirror BM of the etalon 200.

The functional layer FL with the aperture mirror AM coupled thereto is located above the back layer BL, and the back layer include spacer structures (stoppers) ST protruding therefrom, towards the aperture mirror to prevent contact between the aperture mirror AM and the back mirror BM, and in this example, maintain predetermined minimal gap distance $g_{Mn}$ between the mirrors.

The suspension structure SS typically includes a flexure for carrying the aperture mirror AM and/or the mounting frame/ring MF of the aperture mirror AM. The flexure may be for example a region of said functional layer that is patterned in the form of a bending or torsional spring or combinations of these springs or a thin donut-shaped membrane adapted for carrying the aperture mirror. In this example the suspension structure SS includes several suspension springs/flexures attaching the mounting ring MF to an anchor of the functional layer FL. A cavity/window W is provided in the actuation substrate AL to allow light transmission through it.

In the present example electrostatic actuation is used. In the following, the phrase electrostatic actuation is used to refer to "close gap" electrostatic actuation provided by parallel plate electrostatic force between one or more regions (e.g. electrodes) EL of the actuation layer/substrate AL that are electrically insulated from one or more regions (e.g. electrodes) EL of the functional layer FL (e.g. on the mounting ring/frame MF carrying the aperture mirror AM). The actuation layer is electrically insulated from the functional layer and the electrodes EL may be regions of the actuation and functional layers themselves or metal plates coupled thereto.

In this example, the actuation layer AL is located above the functional layer, at the opposite side to the back layer BL. Thus, according to certain embodiments of the present invention, the electrostatic actuation is performed by applying voltage between one or more regions of the mounting ring/frame MF of the aperture mirror AM and one or more regions of the actuation substrate, which is located on the opposite side of the optical cavity OC that define the gap g between the aperture and back mirrors, AM and BM. This provides greater tenability of the displacement between the mirrors (as compared to a case where the electrostatic force is applied between the layers carrying the mirrors MF and BL.

In the initial un-actuated configuration, shown in FIG. 2A, the aperture mirror is located in a close proximity to the back mirror BM. The precise minimal gap distance $g_{MN}$ is defined by displacement limiters (stoppers) ST. An additional function of the stoppers ST is to prevent undesirable displacement of the aperture mirror due to external shock and vibration.

In the actuated state, shown in FIG. 2B, the mounting ring MF and the aperture mirror AM are displaced away from the back mirror BM. This is achieved by applying a voltage V between the one or more regions/electrodes (EL) of the actuation substrate AL serving as an actuating electrode and the one or more regions (EL) of the mounting ring MF.

As will be further described below with reference to FIGS. 5A-5C in some embodiments the one or more regions/electrodes EL of the actuation layer AL include two or more regions that are substantially electrically insulated from one another. Accordingly, application of different electric potentials between these two or more regions of the actuation layer AL and the functional layer FL allows adjusting parallelism between the aperture mirror AM and the back mirror BM. For instance, the two or more regions EL of the actuation layer AL may include at least three regions, arranged such that parallelism between the aperture and back mirrors AM and BM can be adjusted two-dimensionally with respect to two axes.

Figure 3A:
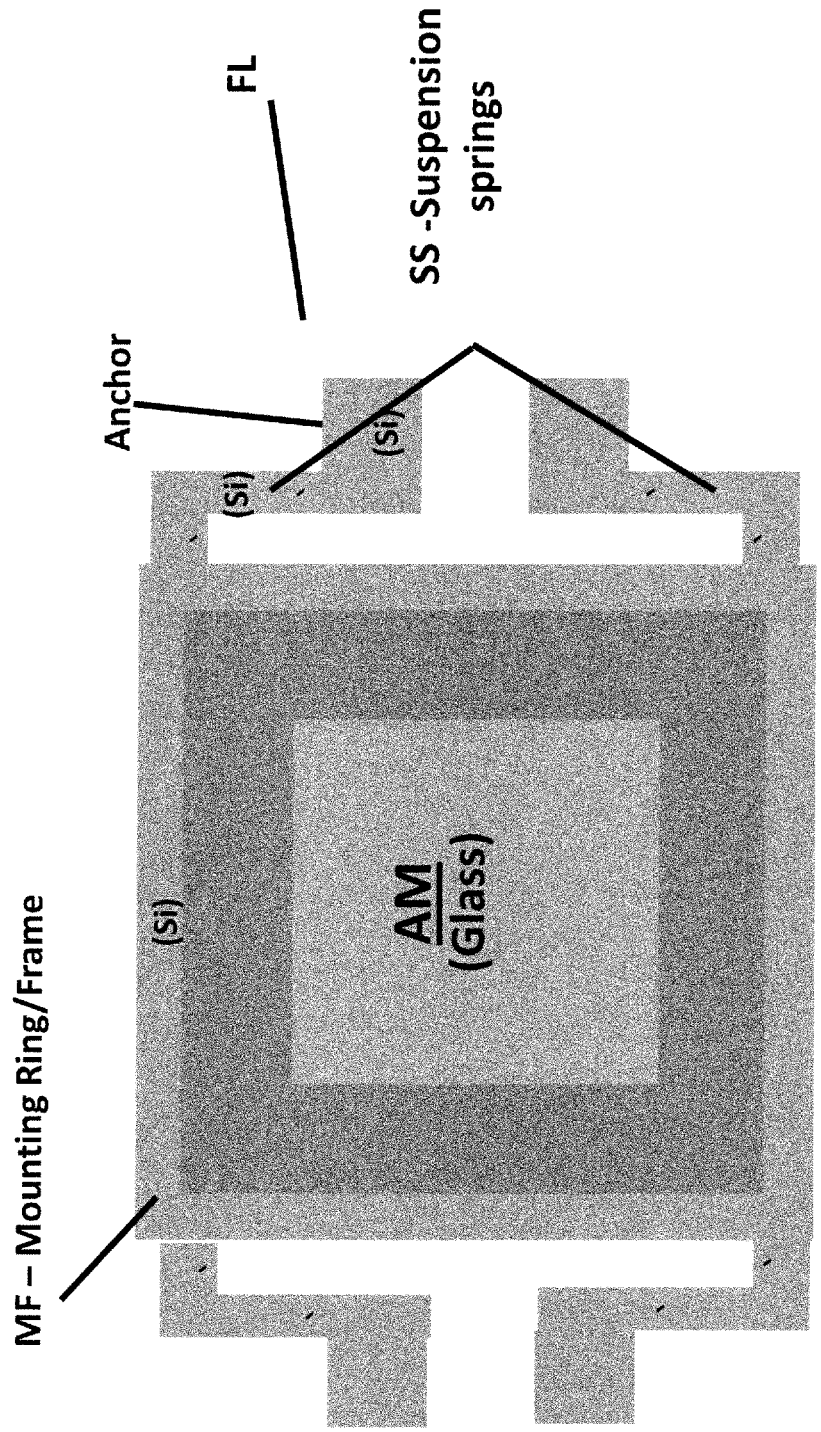

FIGS. 3A to 3C are schematic illustrations of a MEMS Etalon system/device 300 according to certain embodiments of the present invention which is includes actuation and functional layers AL and FL fabricated by Silicon-on-Insulator (SOI) technique (e.g. from SOI wafer structure). The SOI wafer structure includes:

a handle layer HANDLE including Silicon (Si) material/substrate;

a buried silicon dioxide (BOX) layer which is an insulating material (not specifically shown in FIGS. 3A-3C) electrically insulating between the device and the handle layers; and a device layer DEVICE including Silicon (Si) material/substrate.

The functional layer FL of the MEMS Etalon is fabricated by patterning the device layer DEVICE of the SOI wafer and releasing some regions of the BOX layer to release the mounting frame MF and the flexure of the suspension structure SS of the functional MEMS layer FL.

In one of the possible configurations, the mounting ring MF and the suspension spring SS, realized as flexible benders or torsion springs, are fabricated on a device layer of the SOI wafer, while the substrate is a handle layer of the wafer.

The configurations of certain elements of the MEMS Etalon system/device 300 of this embodiment of FIGS. 3A-3C are illustrated in self-explanatory manner in the figures (marked with the same reference numerals used above in FIGS. 1 and 2A and 2B), and need not be described here in further details.

In various implementations of the device illustrated in FIG. 3A the mounting frame MF carrying the aperture mirror is actuated by different techniques, such as by electrostatic actuation (as described above with reference to FIGS. 2A-2B), and/or by piezo-electric actuation (as described below with reference to FIGS. 9A to 9C, and/or by Kelvin force actuation (as described below with reference to FIGS. 8A to 8C), Electrostatic actuation remains one of the most widely used in MEMS devices due to its simplicity, low power consumption, flexibility related to the choice of the electrode's materials and compatibility with the wide range of fabrication processes. In examples of the tunable MEMS Etalon device of FIGS. 3A to 3C where the electrostatic actuation is used, an actuation layer AL of the MEMS Etalon system 300 is fabricated by patterning the handle layer HANDLE of the SOI wafer and removing some regions of the BOX layer between the actuation layer AL and the functional layer FL to release the mounting frame MF and the flexure of the suspension structure SS of the functional layer FL from the actuation layer AL. The actuation layer AL is located above the functional layer FL (with respect to the Z axis), and is insulated from the functional layer FL by remaining regions of the BOX layer between them. The actuation layer AL and the Functional layer FL may then include or serve as electrodes to which voltage can be applied in order to apply electrostatic force on the mounting frame MF, for actuating it.

One of the central challenges of the electrostatic actuation is the presence of so-called pull-in instability, which limits the stable deflection length of the approaching electrode (e.g. in this case, the mounting frame MF of the functional layer FL) towards the static electrode (e.g. actuation layer AL) to one-third of the initial gap between them. Since in the sequential imaging applications, the required range of stable motion is in the order of $g_{Mx}$~300 to 400 nm while the minimal required gap distance ($g_{Mn}$~tens of nm). Consequently, the required stable deflection is much larger than ⅓ of the initial gap and direct actuation by a close gap electrodes (namely by electrodes placed within the optical cavity OC between the mirrors) in the direction toward the back mirror is not feasible. The electrostatic configurations of the tunable MEMS etalon system/device 200 shown in FIGS. 2A-2B and FIGS. 3A-3C overcome this difficulty by using an additional plane/layer, the handle/substrate layer HANDLE, which is used as the actuation layer AL serving as or including an actuating electrode for pulling the aperture mirror AM away from the back mirror therefore increasing the height of the optical cavity. To this end, the actuation layer AL is used as an electrode (this is instead of the back mirror layer BL which is used as an electrostatic electrode in some of the conventional devices).

Thus, in the electrostatic actuation configuration of the present invention, the initial gap between the handle layer HANDLE and the mounting ring/frame MF is significantly larger (at least 4-5 times) than the required maximal deflection ($g_{Mx}$) of the aperture mirror AM. Therefore, the deflection of the aperture mirror in the range $g_{Mn}$ to $g_{Mx}$ is in stable range of the actuator and the pull-in instability is eliminated.

Figure 4A:
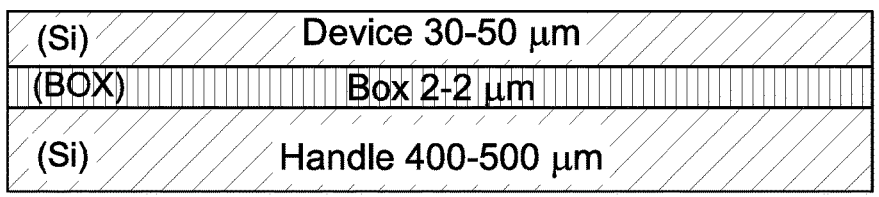
FIGS. 4A-4D show in self explanatory manner processes for fabricating the tunable MEMS Etalon device of FIGS. 3A-3C according to an embodiment of the present invention.
Figure 4A:
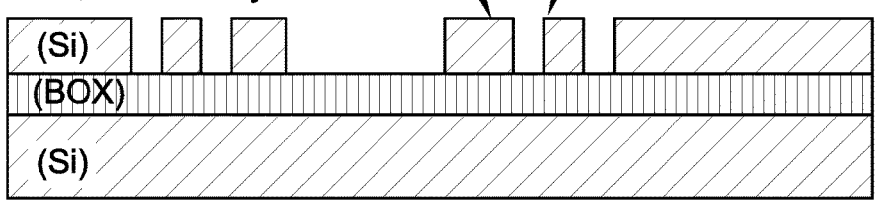
Figure 4A:
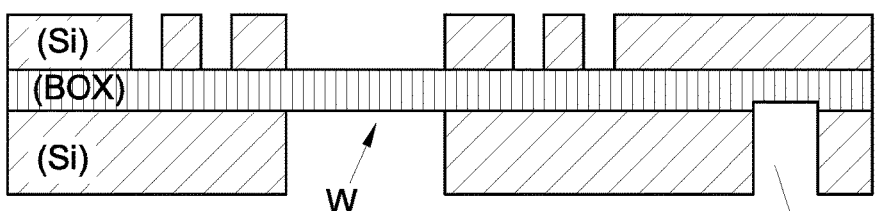
Figure 4A:
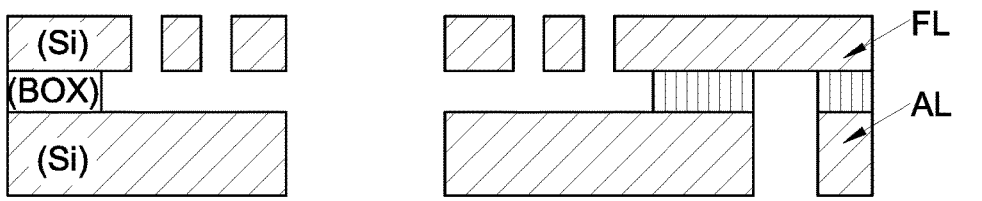

Possible fabrication process of tunable etalon MEMS devices, such as 200 and 300 shown in FIGS. 2A-3C, by SOI technology is shown in self-explanatory manner in FIGS. 4A-4D. For clarity, the electrostatic actuation of the aperture mirror of the tunable MEMS device is illustrated in the figures. Brief description of the fabrication process illustrated in these figures is provided in the following:

FIG. 4A illustrates an SOI fabrication process for fabrication of the functional and actuation layers from the device and handle layers of the SOI wafer respectively. In (a) provided is a SOI wafer including: a handle layer from silicon, a BOX layer, and a device layer from silicon. In (b) the device layer is patterned (e.g. by deep reactive ion etching (DRIE)) to define the suspension structure SS and the mounting frame/ring MF. In (c) the handle layer is patterned (e.g. by DRIE) to define a cavity/window W which allows light transmission through the actuation substrate AL as well as the opening in the handle for the contact pad on the back side of the device layer. In (d) regions of the BOX layer are removed to release the suspension structure SS and the mounting frame/ring MF from the actuation substrate AL.

Figure 4B:
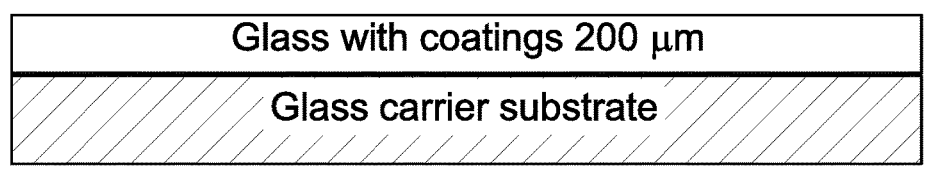
Figure 4B:
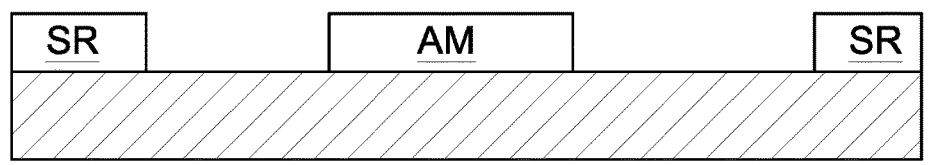

FIG. 4B illustrates a process for fabrication of the aperture mirror AM. In (e) provided is semi-transparent mirror (e.g. with deposited optical titanium oxide layer $TiO_2$) temporarily attached to a carrier substrate. The semi-transparent mirror for example includes a glass layer with coatings (e.g. 200 mm thick) on top of a carrier glass substrate. In (f) the semi-transparent mirror (e.g. glass) is patterned/cut to define the aperture mirror AM, and possibly also to define side spacers SR, which are later used for spacing between the back layer BL and the functional layer FL (see FIG. 4D step (l)). Alternatively, or additionally, off-the-shelf processed glass may also be used for the aperture mirror in some cases.

Figure 4C:
Figure 4C:
Figure 4C:
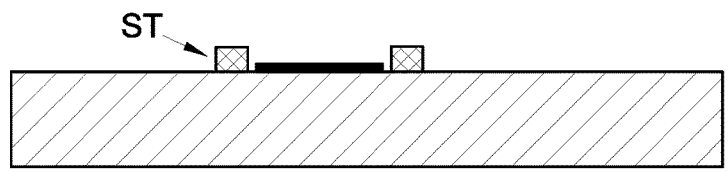
Figure 4C:
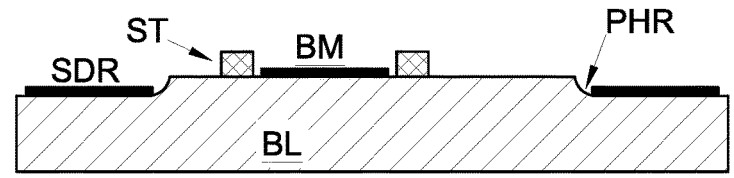

FIG. 4C illustrates a process for fabrication of the back layer BL and back mirror BM. In (g) provided is a starting substrate (e.g. glass substrate/wafer). In (h) reflective layer (e.g. titanium oxide layer $TiO_2$) is laid on the starting substrate. In (i) stoppers ST (e.g. also referred to above as spacers/deflection limiters) are placed on the peripheral region of the back layer BL outside the region of the back mirror BM (e.g. arranged at the sides of the reflective layer or on top of). The stoppers ST may be placed for example by using Atomic Layer Deposition technique (ALD) to precisely control their thickness and thereafter patterning to the required dimensions. In (j) the surface of the starting substrate is etched at the peripheral region PHR to lower the peripheral region PHR surrounding the back mirror BM and stoppers ST, to define a peripheral cavity. The peripheral cavity is needed to provide height difference between the bonded region and the mirror surface and is used to create a small initial pre-stress in the springs after the bonding. Also solder material/pads SDR is deposited on the etched region.

Figure 4D:
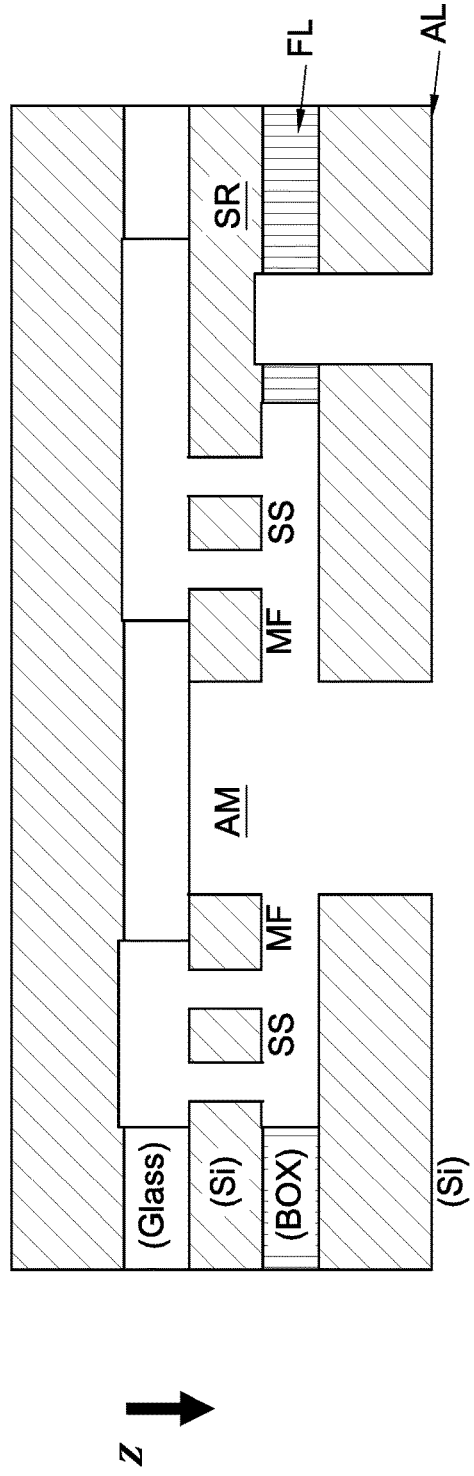
Figure 4D:
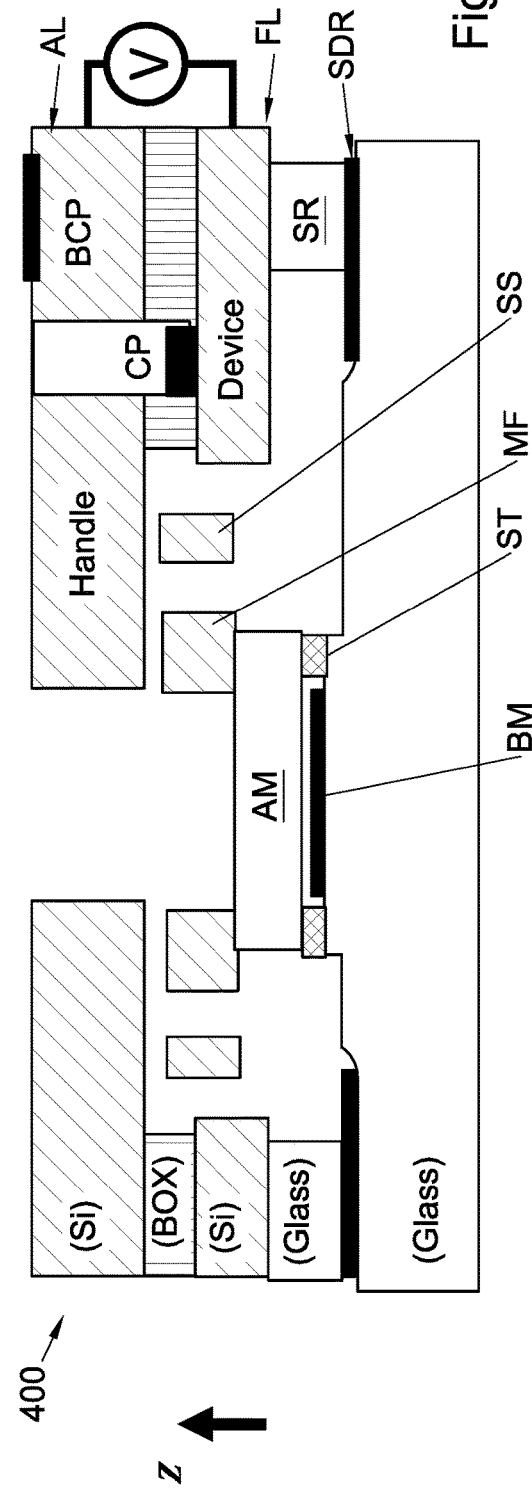

FIG. 4D illustrates the assembly process in which the aperture mirror AM fabricated in FIG. 4B and the back layer BL fabricated in FIG. 4C are coupled from both sides of the functional fabricated in FIG. 4A to yield a tunable MEMS etalon device such as 300, according to an embodiment of the present invention. In (k) the glass layer of the aperture mirror AM fabricated in FIG. 4B is attached to the mounting frame of the functional layer FL and the carrier substrate of the glass layer of the aperture mirror is removed. In (l) back side metal contact pad BCP is attached to the back side of the functional layer FL (e.g. by shadow mask), and the functional layer is attached to the back mirror layer BL via the soldier SDR.

It is noted that due to the lowered peripheral cavity in the peripheral region PHR surrounding the back mirror BM and stoppers ST, to define a peripheral cavity, during the assembly, in step (i), the suspension structure SS (e.g. springs/membrane) is pre-loaded, and pressed to the spacers/stoppers ST. Accordingly, in the un-actuated "off" configuration of the tunable etalon MEMS device (as shown for example in FIG. 2A) springs/membrane of the suspension structure SS touch the stoppers ST and the gap between the aperture and back mirrors, AM and BM, is minimal $g_{Mn}$. The electrostatic actuation of the aperture mirror AM in the "Z" direction is achieved by using the functional layer FL and the handle/actuation layer AL as the actuating electrodes and connecting electric potential V therebetween (e.g. connecting voltage source to the contact pads CP and BCP.

It should be also noted that various techniques can be used for attachment/bonding of the elements of the device described in steps (k) and (l) of FIG. 4D. For example, anodic bonding, direct bonding, eutectic bonding, and/or adhesive bonding. Specifically, in the particular example of FIG. 4D the attachment of the aperture mirror AM glass to the mounting frame/ring MF, in (k) is achieved by anodic bonding, while the attachment of the functional layer FL with the back mirror layer BL is based on the eutectic bonding.

As indicated above, for accurate sequential chromatic imaging applications, it is desired to reduce/remove spatial/lateral chromatic aberration of the etalon. To this end, one of the requirements is that the aperture mirror AM can be positioned with a high level of angular alignment (e.g. parallel) relative to the back mirror BM. This is specifically important in cases where the aspect ratio (e.g. between lateral dimension/width A of the mirrors, and the minimal gap distance $g_{Mn}$ between them) is large (e.g. aspect ratio above 500).

For example, in certain embodiments of the invention the device includes arrangement of multiple electrode regions fabricated on the actuation layer AL, such that the aperture mirror can be actuated with up-down degree of freedom (DOF) along the Z direction, and also tilted (e.g. with respect to two axes X and Y), thus having additional angular DOF(s), allowing to adjust the angular alignment between the aperture mirror AM and the back mirror BM.

Figure 5A:
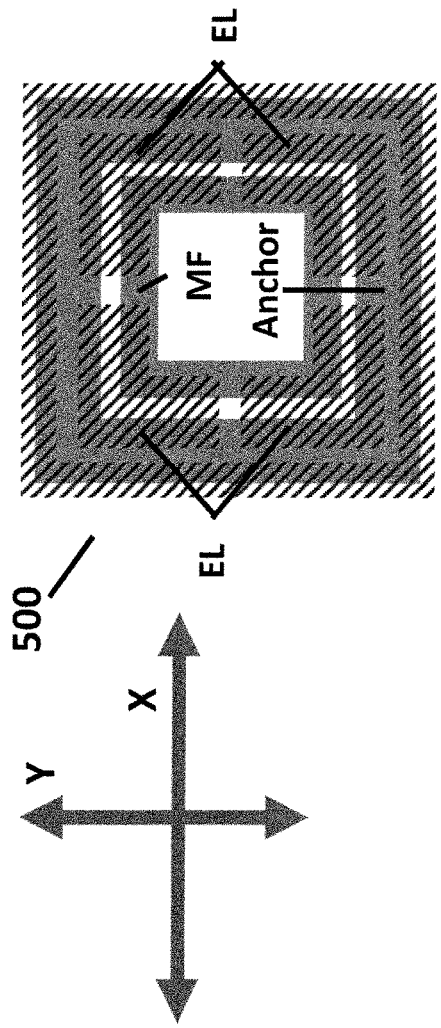
FIGS. 5A to 5C show a tunable etalon system/device 500 according to another embodiment of the present invention which is configured with SOI technology and provides electro-statical actuation control over the tilt of its aperture mirror.
Figure 5B:
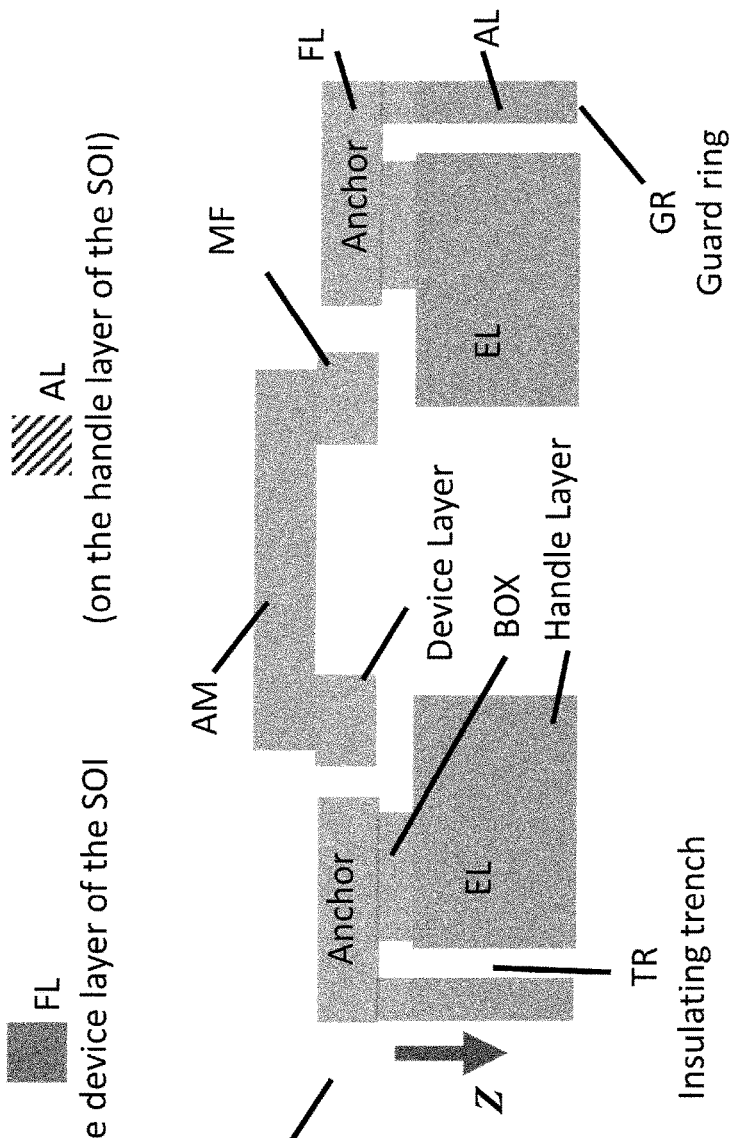
Figure 5C:
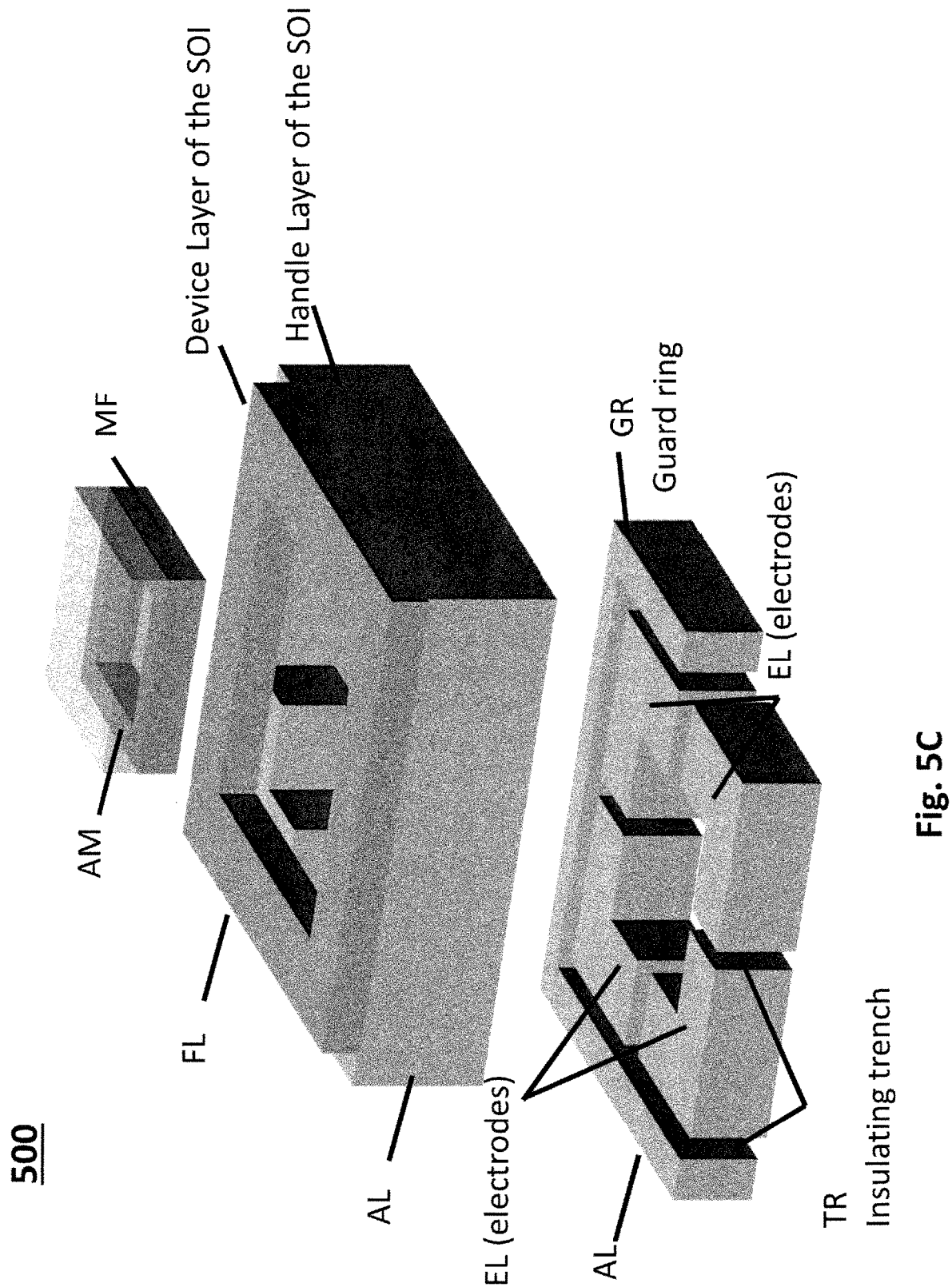

FIGS. 5A, 5B and 5C show respectively in self-explanatory manner two, side and exploded views of a tunable etalon system/device 500, according to an embodiment of the present invention, which is configured with SOI technology as described for example with reference to FIGS. 3A to 4D.

In this example the actuation layer AL, which is fabricated from the handle layer of the SOI wafer is insulated from the functional layer by the BOX layer. In the actuation layer AL, multiple (two or more) electrode regions EL are defined, fabricated from the handle layer of the SOI wafer by patterning tranches TR in the handle layer. The one or more electrode regions (typically four regions) are insulated from one another by the tranches in the handle layer. Accordingly, displacement gap between the aperture mirror AM and the back mirror BM, as well as the tilt of the aperture mirror AM, is adjustable by applying electric potential differences between two or more electric regions EL of the actuation layer AL, and the functional layer FL The device of the present example was fabricated according to the SOI-based fabrication process illustrated in FIGS. 4A-4D. The tunable etalon system/device 500 includes the multiple (four) electrode regions EL, that are fabricated from the handle layer of the SOI wafer. Insulating trench(s) is/are etched (e.g. by Deep Reactive Ion Etching) into the handle layer of the SOI wafer, thus providing electrical insulation between the electrodes EL. The etching is stopped on the insulating BOX layer of the SOI wafer. Accordingly, the electrode regions EL of the handle layer, while being insulated electrically, are mechanically connected to the device layer of the SOI waver since they are attached thereto by the BOX layer of the SOI.

In this example, a "guard ring" structure GR is also fabricated/provided on the handle layer of the SOI. The "guard ring" structure surrounds the electrode regions EL and protects them the mechanical damage, and from being damaged from the fluid used during the dicing process. The electrodes are wired using contact pads, similar to the back contact pad (BCP) illustrated in step (1) of FIG. 4D, which are deposited at electrode regions on the back side of the handle layer of the SOI.

Figure 6A:
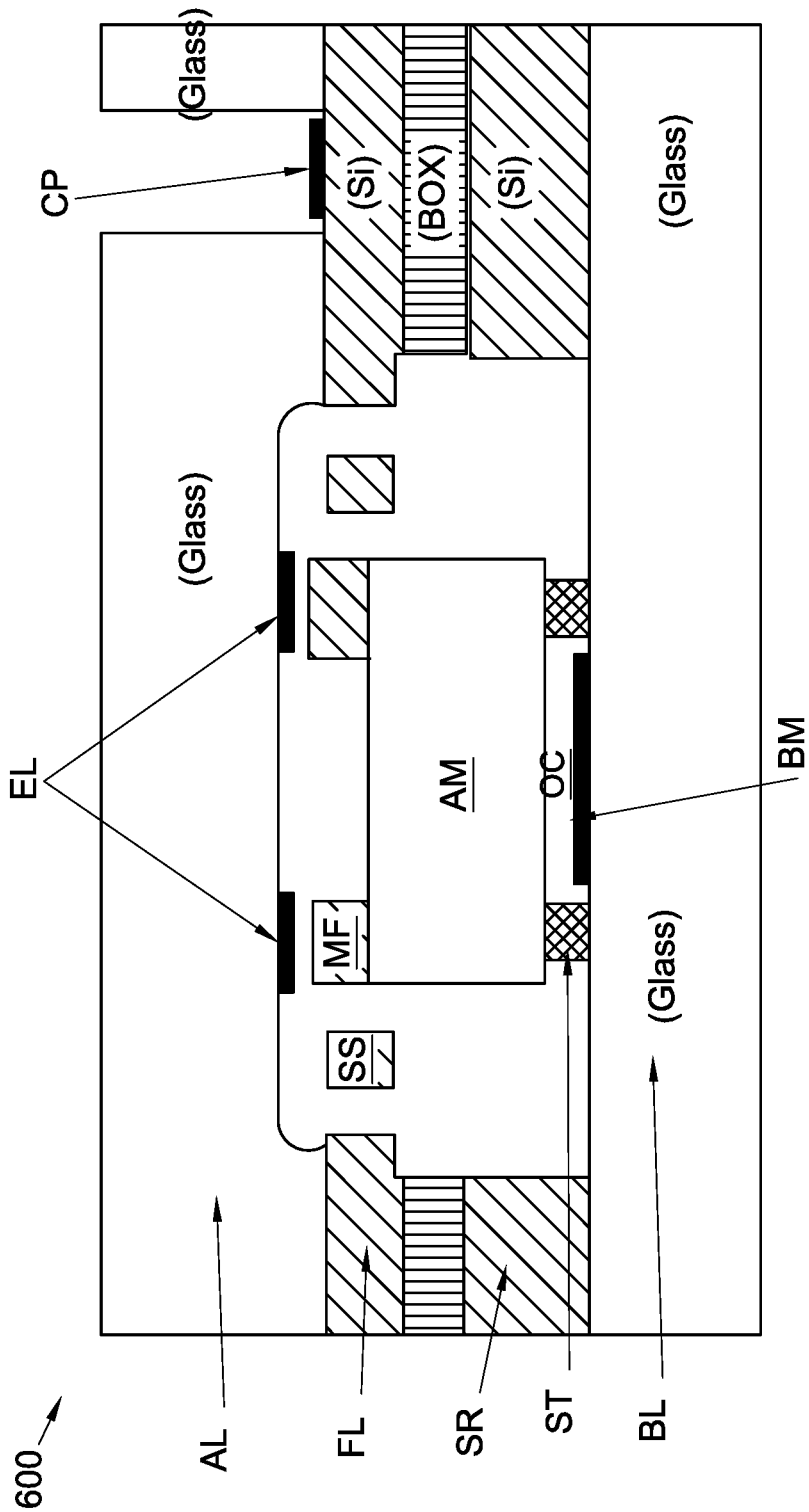
FIGS. 6A to 6E illustrate in self explanatory manner a side view of tunable MEMS etalon device/system and a method of fabrication thereof using the Silicon-on-Glass (SOG) technology, according to an embodiment of the present invention.
Figure 6B:
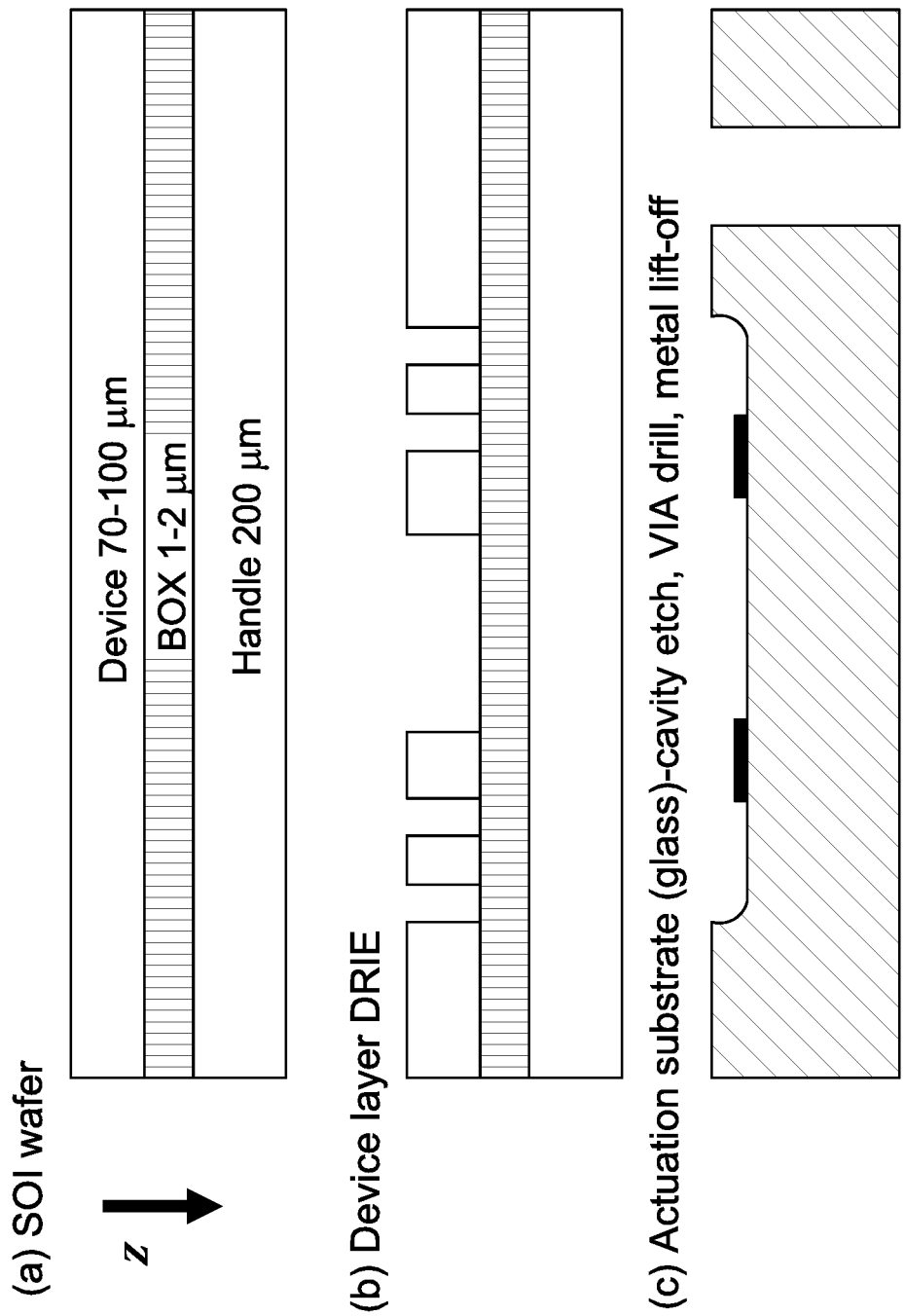
Figure 6C:
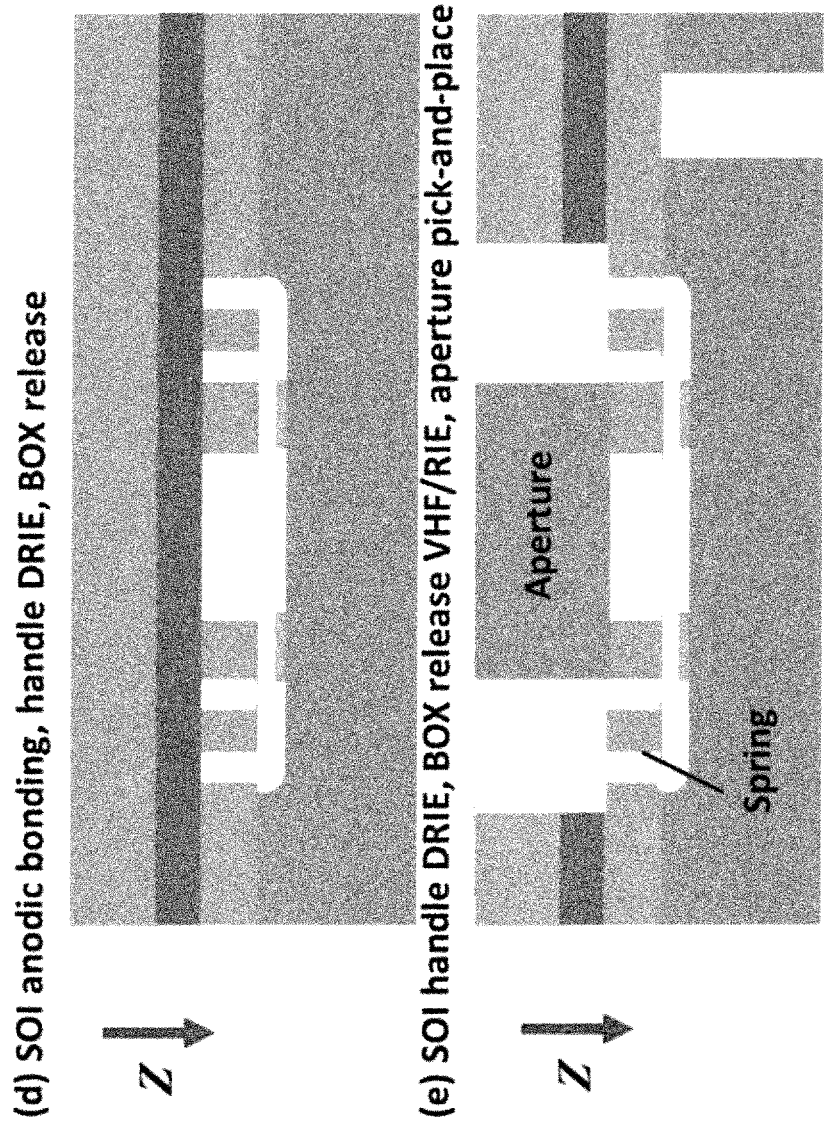
Figure 6D:
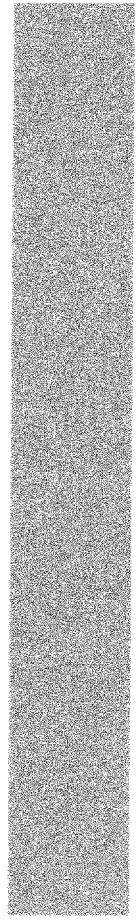
Figure 6D:
Figure 6D:
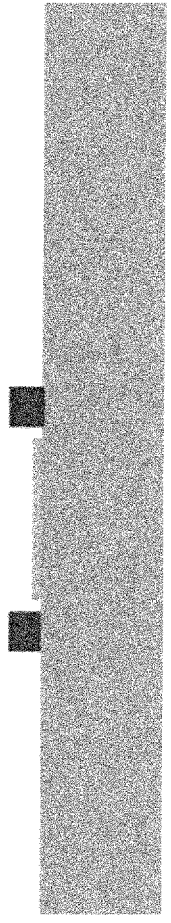
Figure 6E:
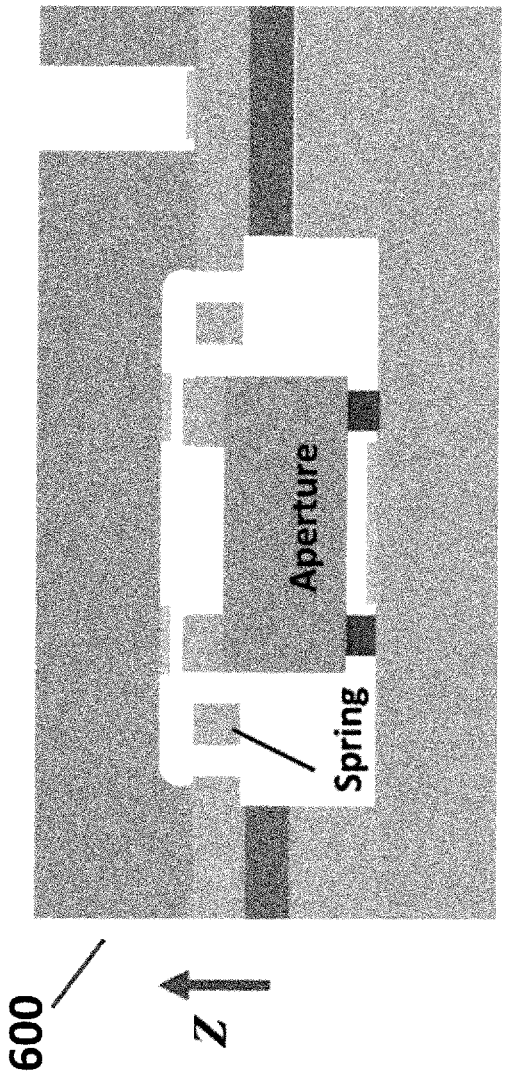

FIG. 6A illustrates a tunable MEMS etalon device/system 600 according to another embodiment of the present invention. As in the tunable MEMS etalon device 500 also in the tunable MEMS etalon device/system 600, electrostatic actuation is used to control both the gap displacement (up-down movement) of the aperture mirror AM, as well as it tilt, which allows to control the aperture mirror AM parallelism relative to the back mirror BM.

In this example, the tunable etalon device was fabricated using the Silicon-on-Glass (SOG) technology. SOG technology is technology is described for example in [2][3].

To this end, in this example the actuation layer AL was fabricated from a glass substrate, instead of being fabricated from the handle layer of the SOI structure as was described above with reference to the embodiment of FIGS. 3A-5C. More specifically, the glass substrate of the actuation layer AL patterned to form thereon a cavity at a location above aperture mirror AM. One or more electrodes are placed in one or more regions in the cavity of the actuation layer AL and configured with electrical connectivity for connecting to a source of electric potential. The functional layer FL is fabricated on the Si device layer of an SOI wafer, which includes a Si device layer, a BOX layer and a Si handle layer. The functional layer FL is patterned to define the flexible support structure SS and the mounting frame MF on which the aperture mirror AM is carried. The handle layer of the SOI, is also patterned to define an aperture window therewithin, allowing light passage in between the aperture mirrors AM and BM. The sides of the handle layer (and possibly the BOX layer) of the SOI serve as side ramps SR spacing between the functional and the bake layers FL and BL.

Here, two or more electrodes EL, typically four metal pads, are deposited on the glass actuation layer AL (e.g. by metal lift-off). Also contact pad CP is deposited on the Si substrate of the functional layer FL (e.g. through via made in the glass layer of the actuation layer AL). As in the embodiments of FIGS. 5A-5C, also here applying voltages between the two or more electrodes EL and the contact pad CP, provides electrostatic actuation, which can be used to control both the gap displacement (up-down movement) of the aperture mirror AM, as well as the tilt of the aperture mirror AM.

FIGS. 6B to 6E show in self-explanatory manner an example of process flows, which can be used to fabricate the tunable etalon MEMS device illustrated in FIG. 6A in which the actuation electrodes EL are deposited on a glass wafer. The glass actuation layer AL and the glass back layer BL are coupled to the functional MEMS layer FL by anodic bonding.

Figure 7A:
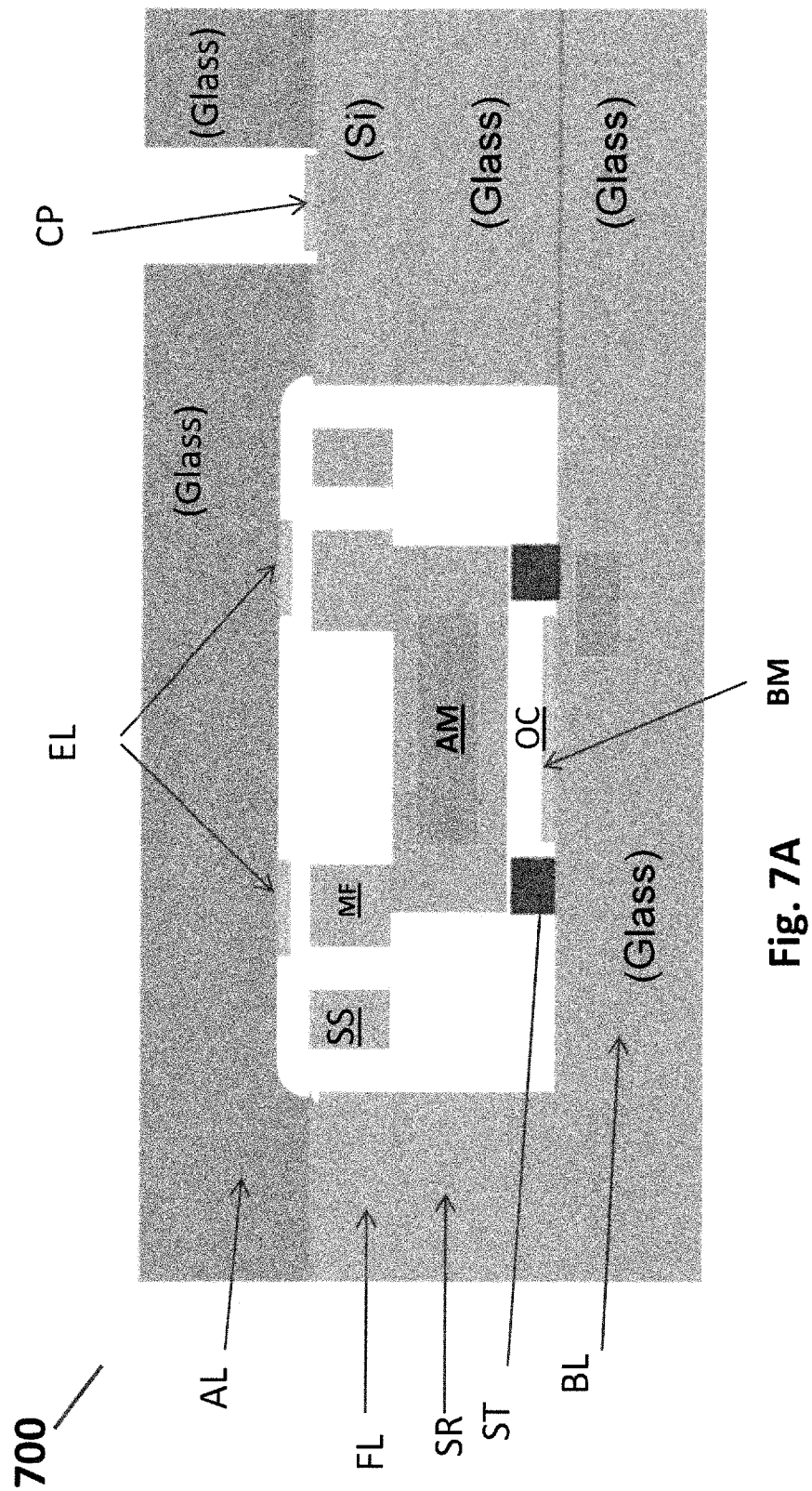
FIGS. 7A to 7D illustrate in self explanatory manner a side view of tunable MEMs etalon device/system and a method of fabrication thereof using the Silicon-on-SOG technology, according to another embodiment of the present invention.
Figure 7B:
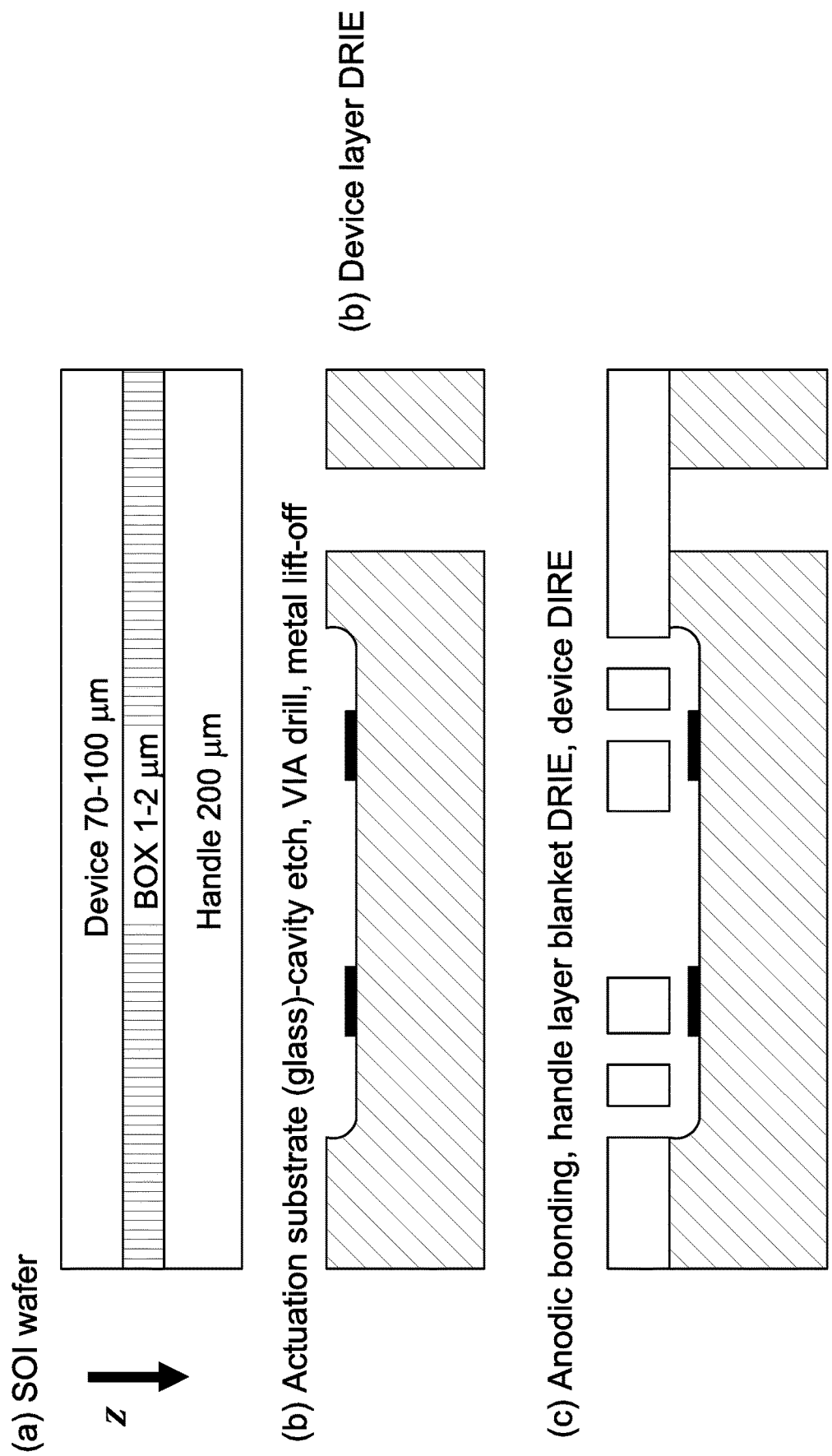
Figure 7C:
Figure 7C:
Figure 7C:
Figure 7C:
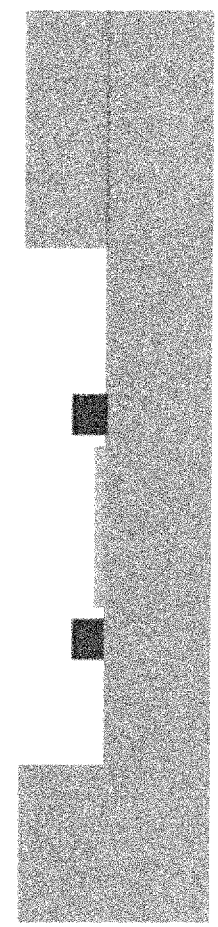
Figure 7D:
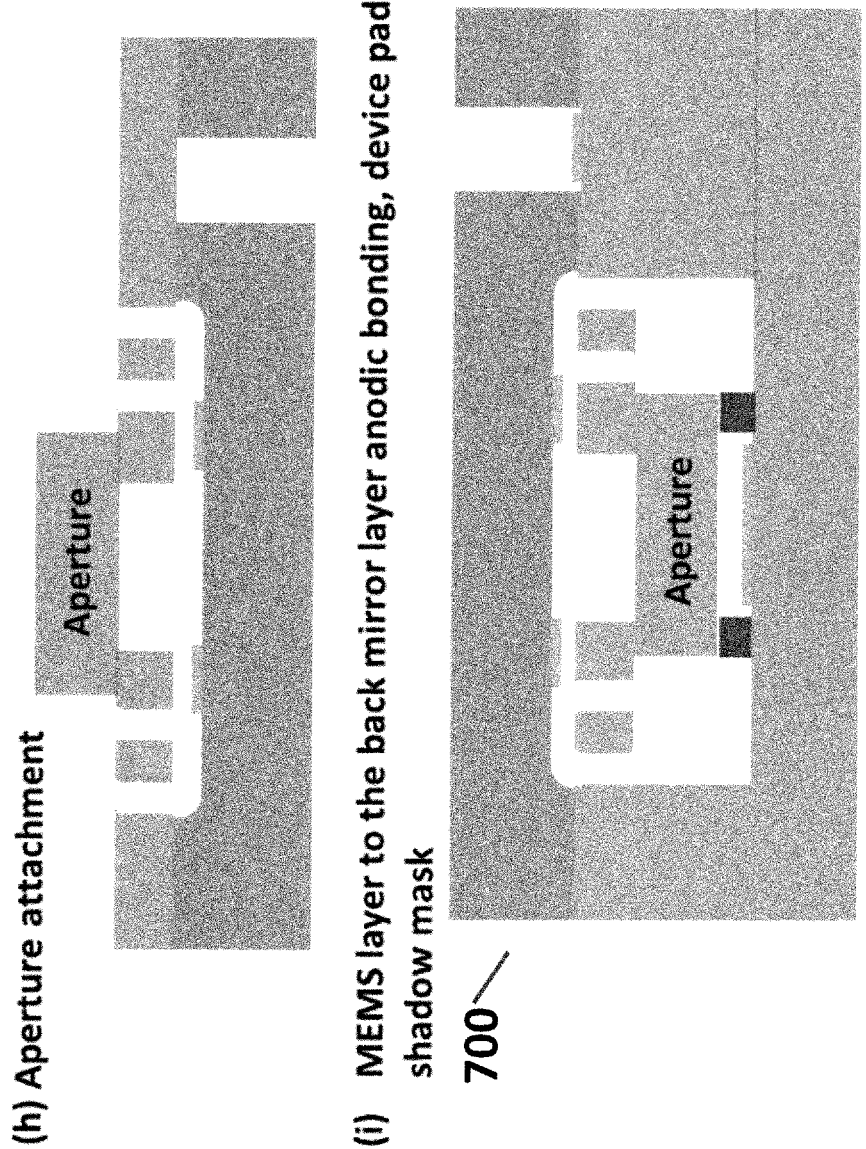

Yet another implementation of the tunable etalon MEMS device 700 according to an embodiment of the invention is illustrated in FIG. 7A. Also in this example the tunable etalon device 700 was fabricated using the Silicon-on-glass (SOG) technology, and double anodic bonding is used to couple the functional MEMS layer FL to the actuation layer AL from above, and to the back layer BL from below. The actuation layer AL is configured similarly as in FIG. 6A, from a glass substrate, with metal electrodes EL placed in one or more regions within a cavity made in the glass substrate of the actuation layer AL and configured with electrical connectivity for connecting to a source of electric potential.

The functional layer FL is fabricated on the Si device layer of an SOI wafer. The functional layer FL is patterned to define the flexible support structure SS and the mounting frame MF on which the aperture mirror AM is placed (e.g. by Pick-and-Place technique). The mounting frame MF (Si material) serves as an electrode of the functional layer FL. Accordingly, the aperture mirror AM tilt and the gap between the aperture mirror AM and the back mirror can be adjusted by applying voltage differences between the functional layer FL and the one or more regions/electrodes EL.

The handle layer of the SOI (and possibly also the BOX layer) of the SOI is removed (e.g. by grinding, etching and/or chemical mechanical polishing). The functional layer FL and the back layer BL are spaced from one another by glass spacers (side spacers) SR, which are coupled between the glass back layer BL and the functional layer FL by anodic bonding to the functional layer FL. The glass actuation layer AL and functional layer FL are coupled together via anodic bonding. FIGS. 7B to 7E show in self-explanatory manner an example of process flows, which can be used to fabricate the tunable etalon MEMS device 700 illustrated in FIG. 7A.

Note that the configurations of the tunable etalon MEMS devices illustrated in FIG. 6A and in FIG. 7A are compatible with the water-level sealing and packaging. In other words, the device layers (e.g. actuation layer AL, functional layer FL and back layer BL) can be bonded at the wafer level, such that the bonding defines a sealed volume where the moving parts of the device (e.g. of the functional layer FL) are confined. In case these tunable etalon MEMS devices are sealed, through the glass via(s) should be fabricated to provide an electrical contact between the electrodes located within the sealed volume and external contact pads).

The embodiments of the tunable etalon MEMS devices described with references to FIGS. 4A-7E above where relied on the use of electrostatic actuation between parallel plate electrodes located on regions of an actuation layer AL of the devices and the mounting frame MF. As indicated above, a common feature of these embodiments is that the parallel plate electrostatic actuation is not configured to act between mounting frame MF of the functional MEMS layer FL (on which aperture mirror AM resides) and the back layer BL (on which back mirror BM resides), but instead the parallel plate electrodes EL are arranged on another layer, the actuation layer AL which is located, relative to the mounting frame MF, on the opposite side from the back layer BL. This allows to have a minimal gap distance gin between the mirrors AM and BM, which is much smaller than in other cases where parallel plate electrodes are placed on the of the two mirrors' planes of the etalon. Also in all the embodiments, stoppers ST are placed on the back layer BL and the suspension structure SS carrying the mounting frame MF with the aperture mirror AM is configured such that in un-actuated state the mounting frame MF and/or the aperture mirror AM touch the stoppers ST and being thereby placed with minimal gap distance $g_{Mn}$ from the back mirror BM.

One of the central difficulties on the design of device which are based on application of parallel plate electrostatic force on the aperture mirror AM is related to the fact that the aperture mirror AM is made of a dielectric layer. In order to be actuated electrostatically, a conductive structure/element (e.g. such as the conductive mounting frame MF and/or a conductive (e.g., metal) layer to be deposited in the aperture mirror AM) should be coupled to the aperture mirror AM. In addition, this layer has to be connected to a voltage source, which is challenging for a movable aperture mirror. As this is solved in the above-described embodiments by arranging the aperture mirror on a mounting frame patterned within a Si layer (device layer) of SOI wafer.

Another way for actuating the aperture mirror AM, which can be used in the present invention is by using Kelvin polarization force (e.g., see [4][5] and references therein). The Kelvin polarization force, which acts on a dielectric body such as aperture mirror AM made of glass, can be used for direct actuation of the aperture mirror AM, while obviating a need for additional conductive structures coupled to the aperture mirror.

Kelvin polarization force is an electrostatic force which acts on a dielectric body that is located within a non-uniform electric field. The force is applied to the dielectric body in the direction along the gradient of the electric field (in the direction from the lower to the higher field).

An advantage of using the Kelvin polarization force for actuating the aperture mirror relates to the fact that differently from the parallel plate electrostatic actuation, the contact between the dielectric body and the electrodes does not lead to an electrical short. The Kelvin force can be tailored in a wide range by properly locating the electrodes. In addition, it is less prone to pull-in instability and can provide larger stable displacement range by properly designing the configuration of the electrodes. Accordingly, the electrodes used for applying the Kelvin polarization force on the aperture mirror may be arranged on the back layer BL (e.g. on the back mirror BM or surrounding it), or on the back actuation layer.

An embodiment of the present invention of a tunable etalon MEMS device 800 which aperture mirror is actuated by Kelvin polarization force is illustrated in self-explanatory manner in FIGS. 8A to 8C.

In general, FIGS. 8A to 8C show the principles of actuation the aperture mirror AM by using an arrangement of Kelvin force electrodes KFL on a plane (such as the plane of the back layer BL) parallel to the aperture mirror AM, which may be dielectric. These principles are described in more details in the following. In this connection it should be understood that a person of ordinary skill in the art will readily appreciate how to implement such an arrangement of Kelvin force electrodes KFL on a plane parallel to the aperture mirror AM in any of the tunable etalon MEMS devices of any of FIGS. 3A-7E described above, to enable actuation of the aperture mirror AM by the Kelvin force.

Turning now to FIG. 8A, an arrangement of Kelvin force electrodes KFL on a plane (in this example the back layer BL is shown.

In the framework of the Kelvin Force actuation approach, no electrodes/conductive elements need to be coupled-to (e.g. deposited on) the aperture mirror AM. Instead, electrode arrangement KFL including multiple electrodes pairs is disposed on a plane substantially parallel to the aperture mirror AM. Two electrodes of each pair connected to two different voltages. This schematic is illustrated in FIG. 8B. The multiple segment-shaped electrodes are deposited under the aperture mirror. A voltage difference is provided between each two adjacent electrodes. The Kelvin force acts in the direction toward the substrate and is proportional to the square of the voltage and the dielectric constant of the material of the aperture mirror AM.

In some embodiments, in order to increase the Kelvin force, the actuated (moving) part (e.g. the aperture mirror AM and/or elements coupled thereto such as the suspension structure SS) may be covered by a layer of a material with high dielectric constant (so-called high k dielectrics. For example the aperture mirror may be coupled-to/covered-by any of the following materials: such as hafnium oxide (k=25), titanium dioxide (k=50) or PbMgNbO$_3$+PbTiO$_3$ (k=22,000). The use of the high k dielectrics increases the Kelvin force proportionally to the value of the dielectric constant. We emphasize that while deposition of the high k dielectric requires an additional processing step, it has the advantage that it eliminates the need to connect the movable part to a voltage source.

There are several advantages to the approach of using the Kelvin force. One relates to the elimination of the possible the electrical short due to the contact between the aperture mirror AM and the electrodes (since the aperture mirror is dielectric in this case). Also, in these embodiments, since the Kelvin force acts on the dielectric of the aperture mirror, there is no need for using a large mounting frame MF (since no additional electrode area is needed).

Note that this approach can be used for the actuation of the aperture mirror toward the back mirror or in the up direction. To control the tilting DOF of the mirror, the electrode groups can be subdivided into three or more sector-shaped segments (see FIG. 8C), where each segment is contacted independently to voltage sources.

Apart from the actuation by electrostatic parallel plate electrodes and Kelvin force electrodes another possible actuation configuration of the aperture mirror AM may be based on the piezoelectric actuation by. In this regards it should be understood that noted that actuation of the tunable etalon MEMS devices of the embodiments described above with reference to FIGS. 3A-7E can also be implemented utilizing piezoelectric layer. In cases where these embodiments are implemented with piezoelectric actuation, the actuation layer AL shown in FIGS. 4A-7E of these embodiments becomes unnecessary and can be obviated.

Figure 9A:
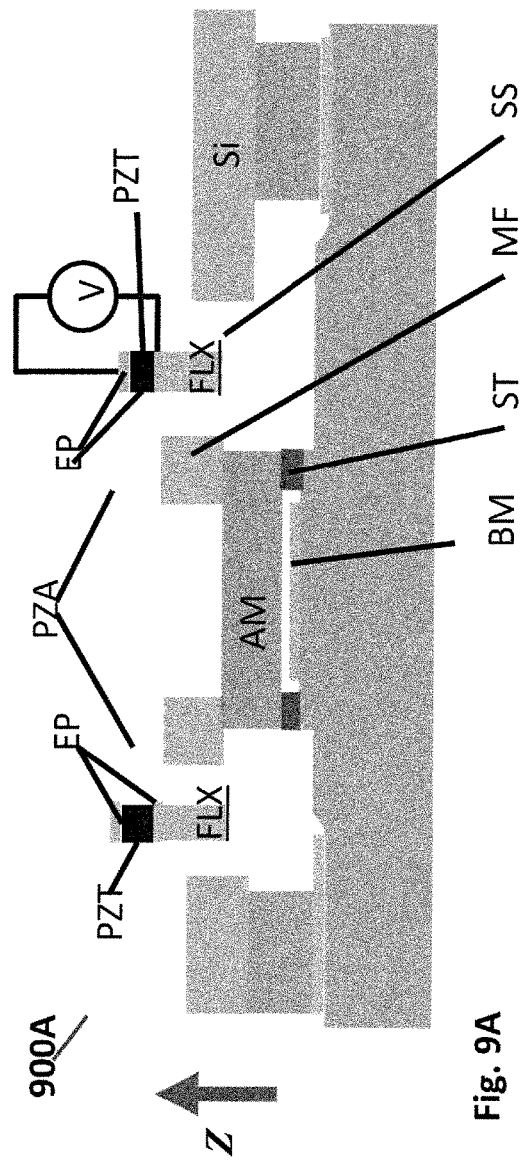
FIGS. 9A to 9C show schematically tunable MEMS etalon devices according to two embodiments of the present invention in which the aperture mirror is actuated by piezo-electric actuation.
Figure 9B:
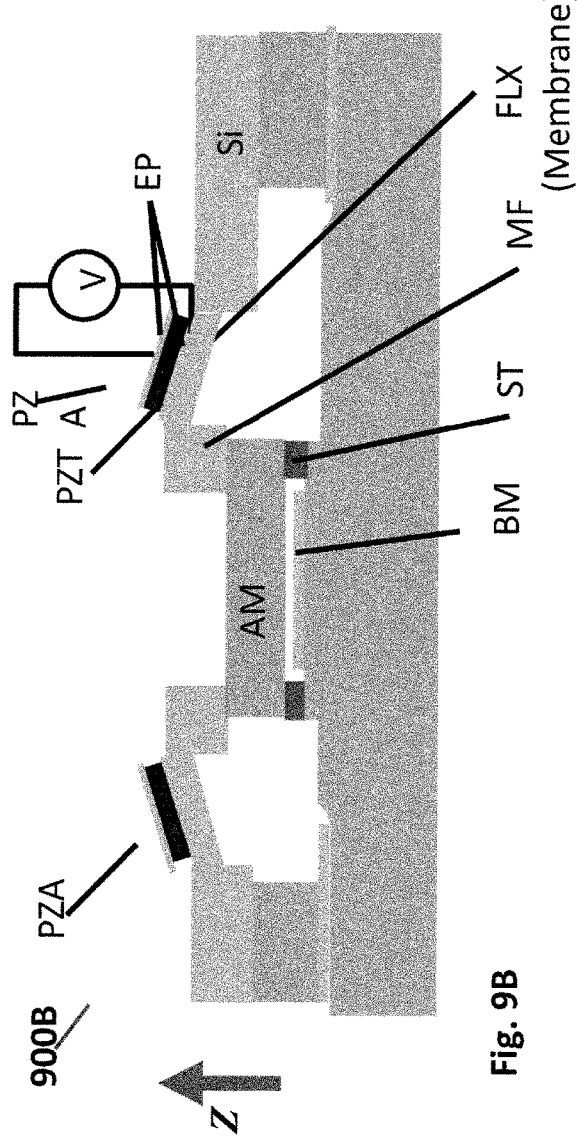

For example, FIGS. 9A and 9B are schematic illustrations showing side views of tunable etalon MEMS devices 900A and 900B according to embodiments of the present invention, in which piezoelectric actuation is implemented. In these examples the device 900A and 900B include functional layer FL and back layer BL that are configured similarly as the functional layer FL and back layer BL of the devices 400, 500, 600 and 700 described with reference to FIGS. 4A-7E above. However in this case an actuation layer AL with the electrodes EL is not needed, and is therefore not illustrated in these figures. Instead, piezoelectric actuator(s) PZA (also referred to herein as piezoelectric actuation structures) are coupled to the flexure(s) FLX of the support structure SS. In this example the piezoelectric actuators PZA are respectively coupled in a Bi-morph configuration to the flexures FLX, such that applying voltage to the piezoelectric material thereof, contracts and/or extracts the piezoelectric material, thereby bending the flexure (deforming the suspension structure) and actuating the aperture mirror AM towards and/or away from the back mirror BM. This provides for adjusting a distance between the aperture mirror AM and the back mirror BM.

Figure 9C:
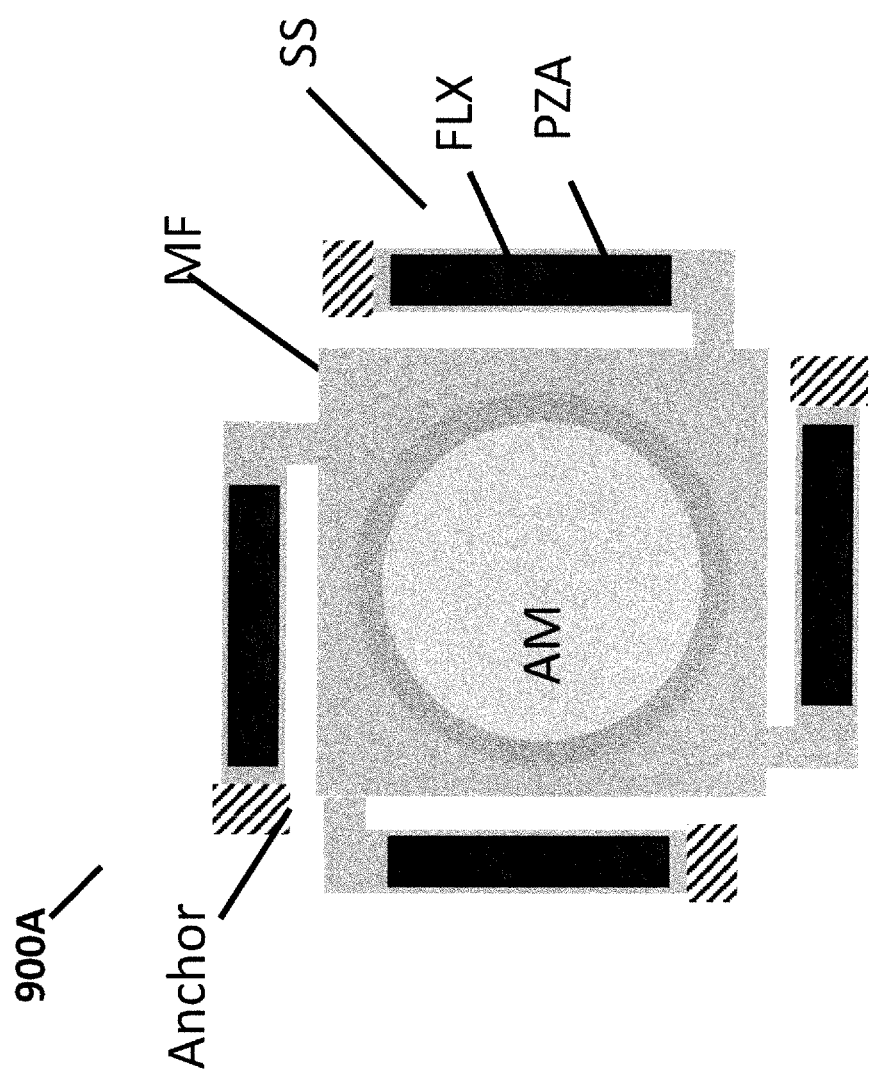

The exemplified devices 900A and 900B are similar except that in devices 900A the flexure FLX is in the form of a springs/bending-beams (see self-explanatory illustration of the functional MEMS layer FL of the device 900A in FIG. 9C), wherein in the device 900B the flexure FLX is in the form of a membrane surrounding the mounting frame MF. Spring/bending beam type flexures are advantageous since the manifest relatively low stiffness and can be actuated by relatively low voltages. In addition, the use of the beam type structures results in smaller footprint of the device. On the other hand, membrane based configuration, while more stiff and requiring larger voltages for acceptable footprint, has an advantage that the same structure is used simultaneously as a suspension and as a sealing layer.

It is noted that the materials used for piezoelectric actuation in this example is lead zirconium titanate, also referred to as PZT. The material can be deposited on top of Si or glass material substrate/wafer (for example by means of sol-gel deposition or RF sputtering as well as by pulsed laser sputtering [6]). The PZT is placed between two electrodes EP allowing application of voltage thereto. Other piezoelectric materials that can be used as piezoelectric actuators in various embodiments of the MEMS devices of the present invention, may include for example Zn oxide and/or aluminum nitride.

An advantages of the piezoelectric actuation technique described above is that is that the electric contacts of the piezoelectric actuating layer/material is located on top of the tunable etalon MEMS device (above the functional layer). This simplifies packaging of the device as it allows to easily connecting to the device to voltage source while obviating need for through vias.

It should be noted that the actuation Kelvin force and piezoelectric actuation techniques described above with reference to FIGS. 8A to 9C, can also be implemented in cases where the functional MEMS layer FL of the tunable MEMS etalon is made of insulting materials, such as glass.

FIGS. 10A and 10B show respectively two examples of a tunable MEMS etalon devices, 1000A and 1000B whose layers are made fully from glass, according to two embodiments of the present invention. An advantage of a fully glass tunable MEMS etalon devices as those shown in FIGS. 10A and 10B is that there is low or non thermal mismatch between the layers. This provides accurate and robust operation of the device in various temperature conditions. Indeed a glass layers cannot be actuated electrostatically in a straightforward manner. However, as indicated above with reference to FIGS. 8A to 8C and 9A to 9C, Kelvin force actuation or piezoelectric actuation can be used for actuation a functional MEMS layer FL made of dielectric material such as glass functional layer FL in these examples.

In devices, 1000A and 1000B the functional layer includes a glass substrate that is pattered to accommodate/define frame MF, the suspension structure SS (i.e. the flexure FLX) and the aperture mirror AM. The back layer BL also includes or is formed by glass substrate.

In the present example, the glass substrate of the back layer BL is attached to the glass substrate of the functional layer FL by sealing material which provides: vacuum (airtight) sealing, and/or moisture and/or contamination sealing of the interior of the device. To this end, in some cases the device is configured to be vaccum sealed. In other cases it is not operated in vacuum, but is sealed to moisture and/or other contamination ao the functional layer is protected against moisture to prevent sticktion, dust and other contaminants which may be trapped within the small cavity and prevent mechanical motion.

It is understood that alternatively, instead of sealing material, other bonding techniques can be used to attach the back layer BL to the functional layer FL.

It is noted that the in the specific examples 1000A and 1000B of the full glass tunable MEMS etalon devices in FIGS. 10A and 10B, the flexure FLX is membrane type springs of small thickness t which completely surrounds and connects aperture mirror AM to the mounting frame MF.

Figures 10C, 10D:
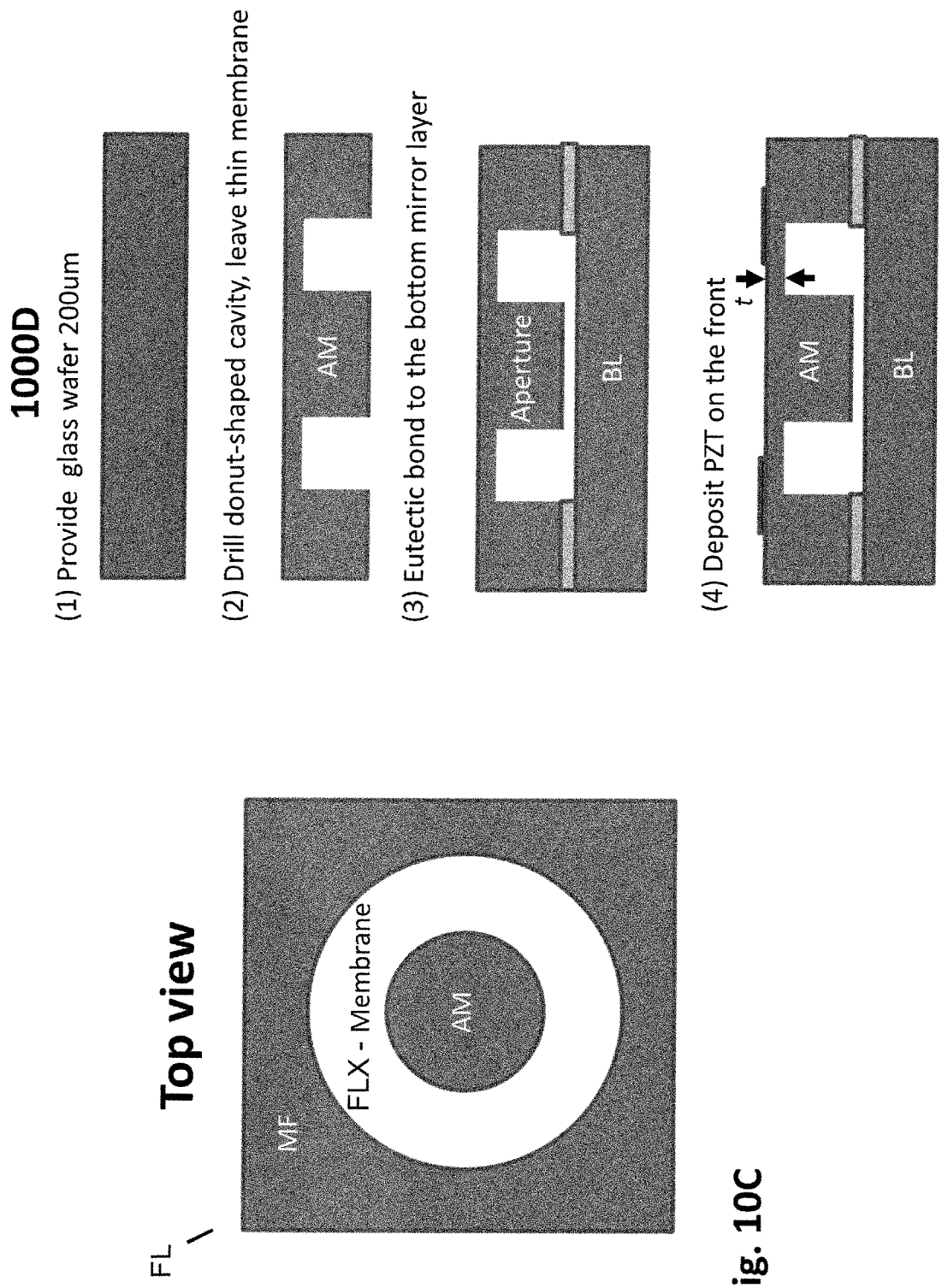

One of the central advantages of a fully glass device with a membrane-type spring is that it can be (vacuum) sealed at the wafer level (thus obviating a need for further packaging). FIG. 10C shows a top view of a functional layer FL of the devices 1000A and 1000B, which provide such sealing. The functional layer FL is in the form of a continuous sheet/layer that is patterned to have a thin membrane region SS enclosed, within the peripheral region of the frame MF, and enclosing an aperture region at which aperture mirror AM is being suspended AM. The thin membrane may be air tight and may seal a space enclosing the aperture mirror between the functional layer and the back layer.

In this regards it should be understood that wafer level sealing can also be realized in the embodiments 300, 500, 600, 700 and 800 of the tunable MEMS etalon devices of the invention in which the Functional MEMS layer FL is made of silicon (Si). To achieve that, the flexure (spring) of the support structure SS of those devices, should be configured as membrane type spring (e.g. being in the form of continuous layer/sheet connected between the mounting frame MF and the aperture mirror AM from all sides.

As illustrated in FIG. 10A, in the device 1000A piezoelectric actuators PZA (e.g. such as those described above with reference to FIGS. 9A to 9C), are used to actuate the membrane type flexure FLX. In this case, when the flexure FLX is membrane type, functional layer is coupled to the back layer such that the aperture mirror AM protrudes from the membrane flexure FLX towards the back mirror BM. The piezoelectric actuators PZA are coupled to a surface of the membrane flexure FLX at an opposite side of the protrusion, such that application of electric voltage through the piezoelectric material (e.g. PZT) of the actuators deforms the membrane and adjust the gap distance between the aperture mirror AM and the back mirror BM of the etalon.

In the device 1000B illustrated in FIG. 10B, Kelvin polarization force/electrodes KFL (e.g. such as those described above with reference to FIGS. 8A to 8C), are used to actuate the membrane type flexure FLX. In this case, the functional layer FL is coupled to the back layer BL such that the aperture mirror AM protrudes from the membrane flexure FLX in a direction opposite to the back layer BL. The arrangement of Kelvin polarization force/electrodes KFL is located on a surface of the back layer BL such connecting the electrodes KFL to suitable voltages, applies Kelvin polarization force on the continuous surface of the functional layer FL and the back layer BL allowing to adjust a distance between the aperture mirror AM and the back mirror BM. Note that the electrodes of the Kelvin polarization force can be located also at the opposite side of the aperture and actuate it in the direction apart from the back plate.

FIG. 10D shows in self explanatory manner a process 1000D for fabricating a tunable etalon MEMS devices such as those illustrated in FIGS. 10A and 10B. Step (4) specifically related to the fabrication piezoelectric actuation, as in the device 1000A.

Figure 10F:
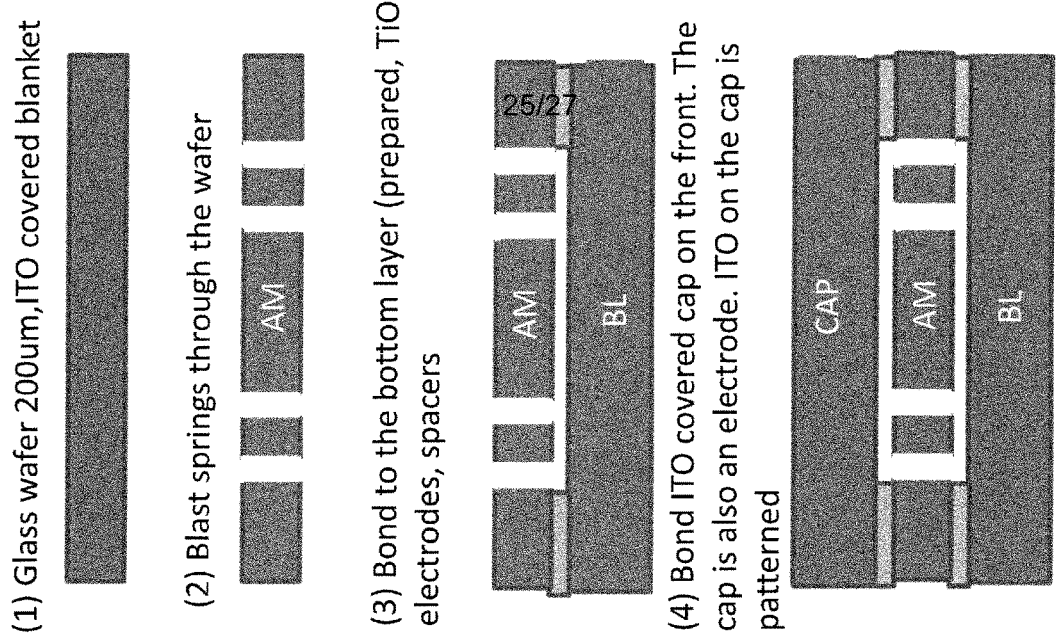
Figure 10E:
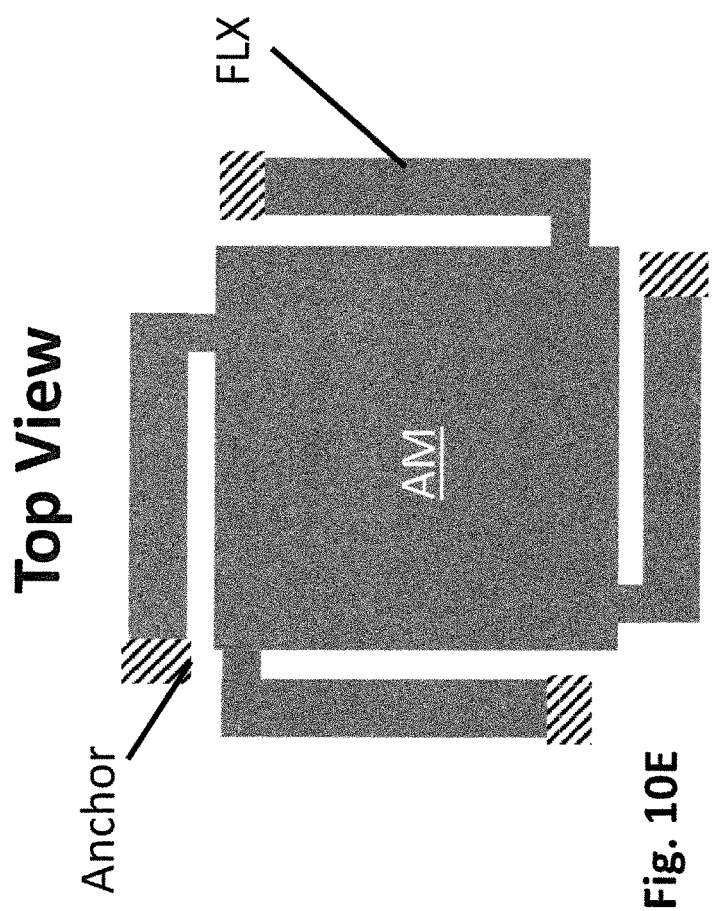

It should be understood the fully glass made tunable etalon MEMS device can also be realized with the flexure FLX of the suspension structure SS implemented as bending beam spring (e.g. suspension structure SS with shape similar to that shown in FIG. 3B, but made of glass material). The functional memes layer FL configured in this way is illustrated schematically in self explanatory manner in FIG. 10E. FIG. 10F is a flow diagram exemplifying in self explanatory manner the fabrication process of a tunable etalon MEMS devices such as those illustrated in FIGS. 10A and 10B but having the flexure FLX of the suspension structure SS implemented as bending beam spring.

It should be noted that here, in case sealing of the cavity between the mirror is required then a cap wafer layer CAP should be used coupled to the functional layer from above. This is illustrated for instance in step (4).

It should be noted that in certain implementation fabrication of the bending beam flexure (as in operation (2) of FIG. 10F) may be easier and less challenging, than fabrication of the membrane type spring (as in operation (2) of FIG. 10D). This is because in the former case the processing of the glass is through the entire thickness of the glass and no control of the machining or etching depth (the control of the membrane thickness) is necessary.

Figure 11A:
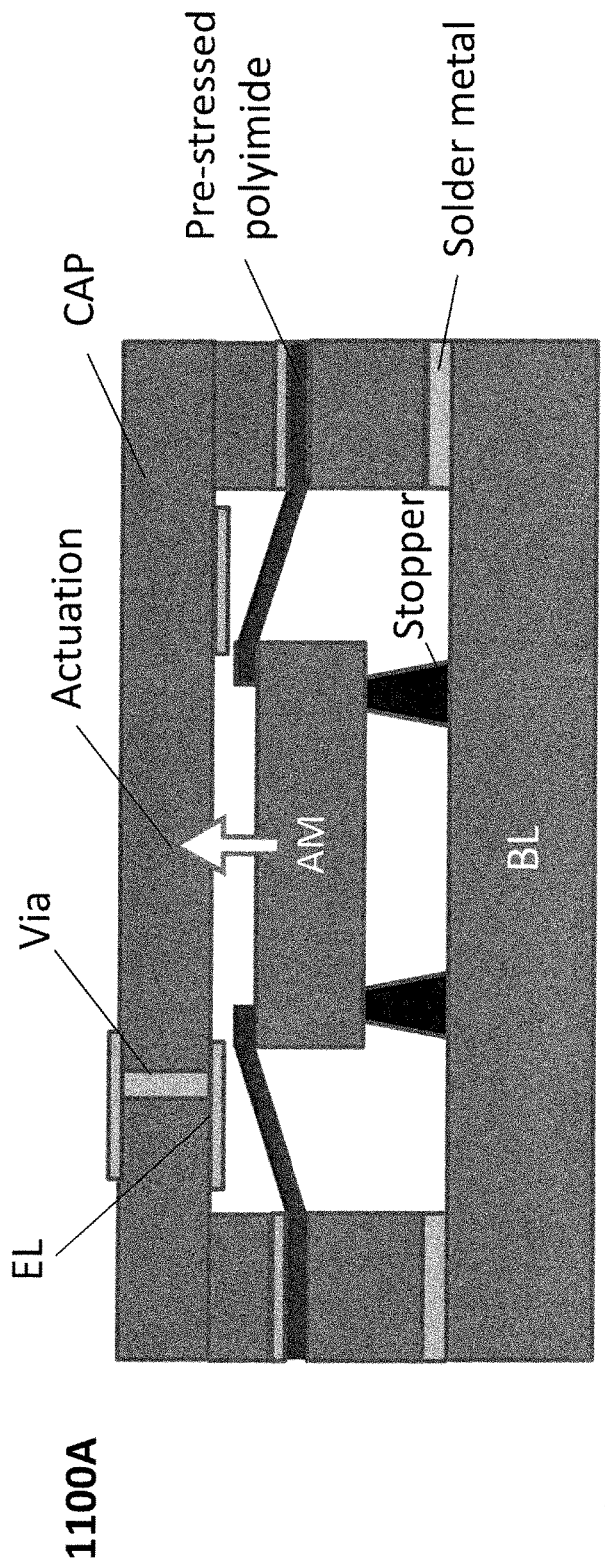
FIGS. 11A and 11B show the configurations of two tunable MEMS etalon devices configured according to certain embodiments of the present invention.
Figure 11B:
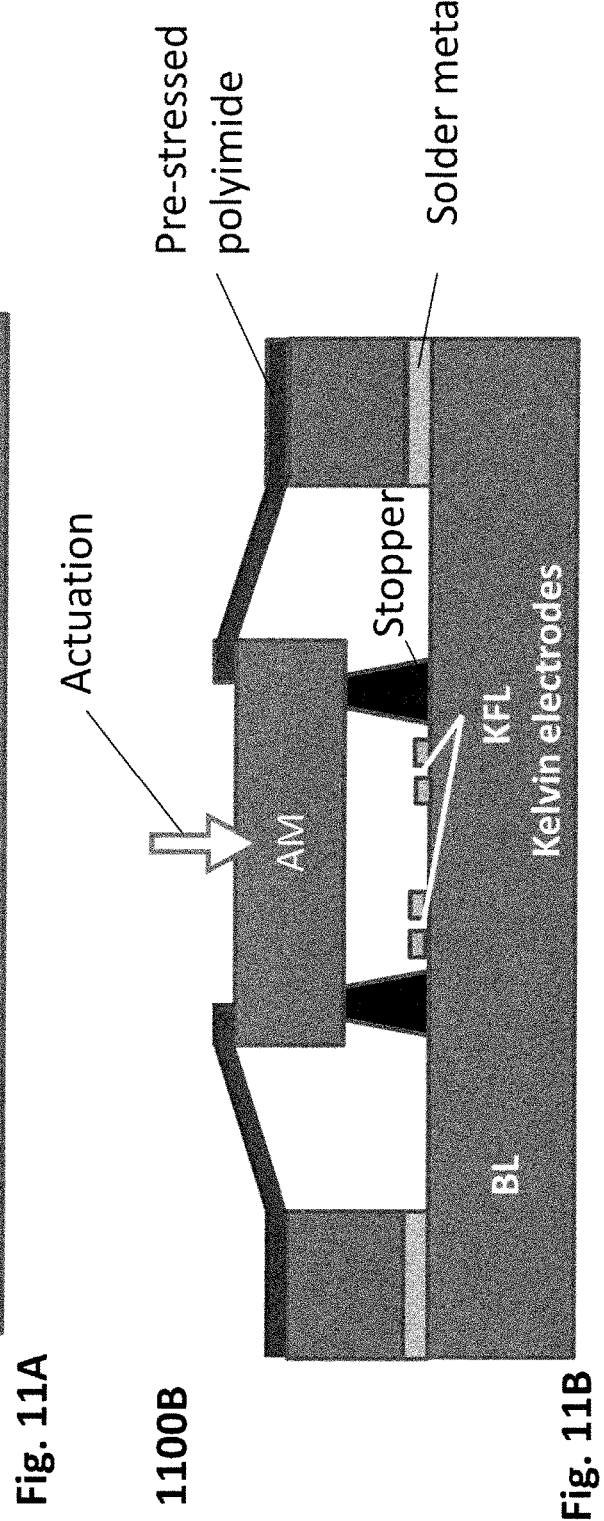

FIGS. 11A and 11B show in self explanatory manner the configurations of tunable MEMS etalon devices 1100A and 1100B configured according to another embodiments of the present invention. The devices 1100A and 1100B are made of glass layers (the back layer, the functional layer and possibly also the cap layer are made of glass). In this example the suspension structure SS of the functional layer includes a spring flexure made of polymeric material (e.g. pre-stressed polymeric material) that is coupled between the functional layer FL and the aperture mirror AM. In this specific example the spring flexure is made of pre-stressed polyimide shaped as membrane-type spring. In the device 1100A the functional layer FL is covered by a cap layer CAP from above and actuation is performed via electrostatic electrodes EL in the cap layer CAP. In the device 1100B actuation is performed by an arrangement of Kelvin force electrodes on the back layer BL.

An advantage of this configuration of devices 1100A and 1100B is that they can be fabricated at very low cost and manufacturability due to availability of of-the-shelf polyimide flexes with pre-fabricated embedded conductive layers.

Figure 12:
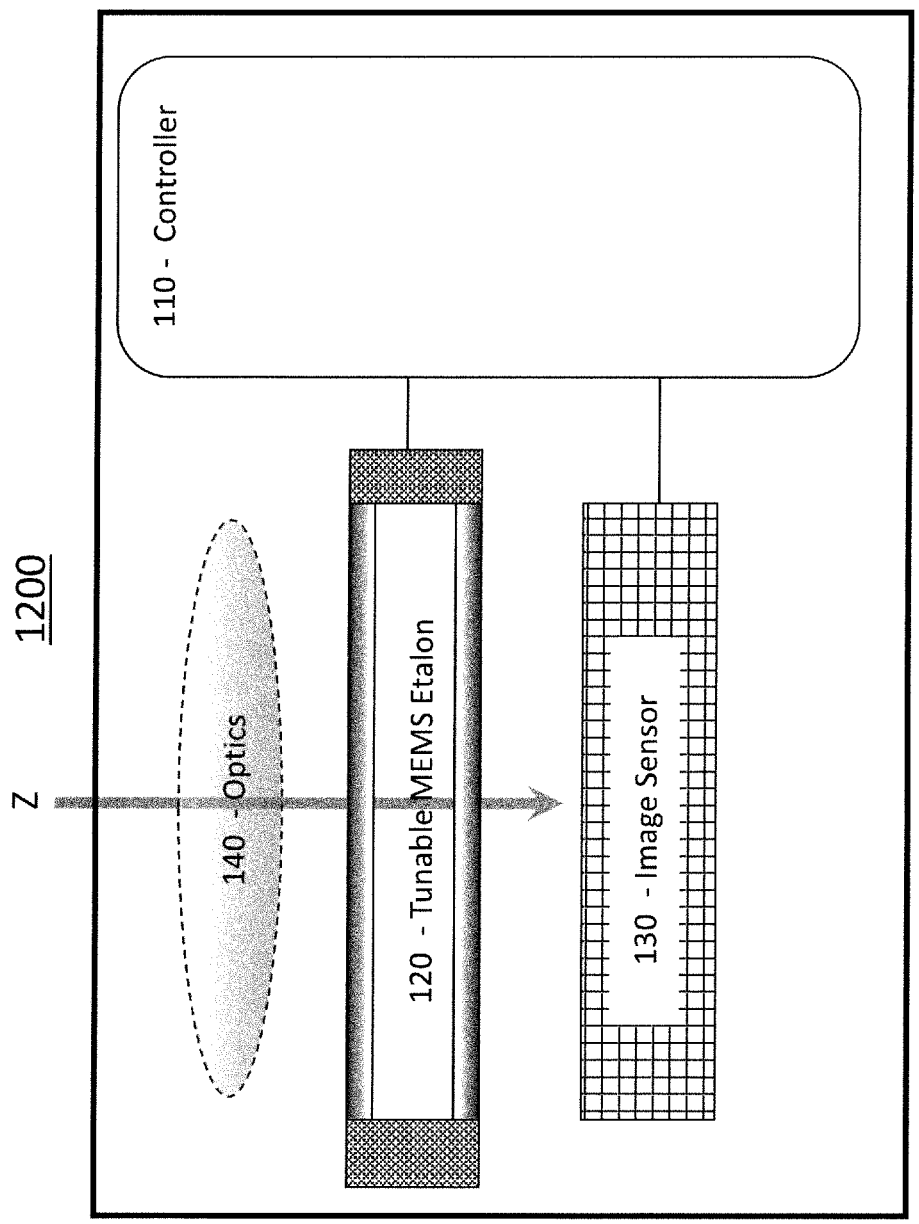
FIG. 12 is a block diagram of a sequential color imaging system configured according an embodiment of the present invention and including a tunable MEMS etalon device according to an embodiment of the present invention located in the optical path of an image sensor.

Reference is now made to FIG. 12 illustrating schematically, in a block diagram, a sequential imaging system 1200 configured according to an embodiment of the present invention. The system 1200 includes an image sensor 130 (such as a multi-pixel monochromatic sensor), and a tunable MEMS etalon device 120 configured according to the present invention as described above. The tunable MEMS etalon device 120 serves as tunable spectral filter 120 and is placed in the general optical path of light propagation towards the sensor 130 (e.g. intersecting the Z axis in the figure). Optionally an optical system 140 (e.g. imaging lens(es)) is also arranged in the optical path of the sensor 130.

Color image acquisition can be carried out by the device 1200 in similar way as described for example in patent application publication WO 2014/207742, which is assigned to the assignee of the present application and which is incorporated herein by reference. The tunable MEMS etalon device 120 of the embodiment of the present invention, which is used in the imaging system 1200, is configured to provide a spectral filtration profile, which suitable for sequential color imaging with high color fidelity.

More specifically, according to various embodiments of the present invention the materials of the back and aperture mirrors AM and BM of the etalon 120 and the tunable distance/gap g between them are configured such that the spectral filtration profile of the etalon 120 is tunable in the spectral ranges in the visual and possibly also in the IR/near-IR regimes which are suitable for imaging of color images (for example with colors corresponding to the RGB space or to a hyper spectral color space). Also the aperture mirrors AM and BM of the etalon 120 and the tunable distance/gap g between them may be configured such, that the transmission profile properties (e.g. FWHM and FSM) of the etalon are also suitable for sequential color imaging. For instance the materials of the aperture mirrors AM and BM and the tunable distance/gap g between them may be selected such that the FWHM of the spectral transmission profile of the etalon is sufficiently wide to match the FWHM of the colors in the conventional RGB space, and also that the FSR between successive transmission peaks in the spectral transmission profile is sufficiently large to avoid color mixing (to avoid simultaneous transmission to the sensor of different colors/spectral-regimes to which the sensor is sensitive). Further, the etalon 120 may be relatively laterally wide (relative to the gap g between its mirrors), such that it is wide enough to interpose in the optical path between the optical system 140 and all the pixels of the sensor 130, and on the other hand the gap between its mirrors is small enough to provided the desired spectral transmission properties and tunability of the etalon 120. This is achieved by using the tunable MEMS etalon device according to the present invention as described for example in one or more of the embodiments above.

The system 1200 may also optionally include a control system (controller) 110 electrically connected to the image sensor 130 and to the tunable MEMS etalon device 120 and configured and operable for capturing a colored image by sequential acquisition of monochromatic frames corresponding to different colors (different spectral profiles) from the sensor. For example the controller 110 may be adapted for creating/capturing a colored image by sequentially operating the tunable MEMS etalon device 120 for sequentially filtering light incident thereon with three or more different spectral filtering curves/profiles, and operating the sensor 130 for acquiring three or more images (monochromatic images/frames) of the light filtered by the three or more spectral curves respectively. The tunable spectral filter 120 is operated to maintain each of the spectral filtering curves for corresponding time slot durations, during which the sensor 130 is operated for capturing the respective monochrome images with respective integration times fitting in these time slots. Accordingly each of the captured monochrome images corresponds to light filtered by a different respective spectral filtering curve and captured by the sensor 130 over a predetermined integration time. The controller is configured for receiving and processing readout data indicative of the three or more monochrome images from the sensor and generating data indicative of a colored image (namely an image including information on the intensities of at least three colors in each pixel of the image).

We claim:

1. A tunable Micro-Electro-Mechanical (MEMS) Etalon system comprising:
    a functional layer patterned to define a suspension structure for suspending a first mirror, being an aperture mirror of the Etalon;
    an aperture mirror coupled to the suspension structure; and
    a back layer comprising a second mirror, being a back mirror of the Etalon;
    wherein a displacement between said aperture mirror and said back mirror adjustable by means of electrostatic forces; and wherein the functional layer with the aperture mirror coupled thereto is located above the back layer and the etalon system further comprises an actuation layer located above the functional layer such that one or more regions of the actuation layer are electrically insulated from the functional layer; said displacement between said aperture mirror and said back mirror is adjustable by applying electric potential difference between the one or more regions of the actuation layer and the functional layer to thereby cause said electrostatic forces between them.

2. The tunable MEMS Etalon system of claim 1 wherein the functional layer with the aperture mirror coupled thereto is located above the back layer and the back layer comprises spacer structures protruding therefrom towards the aperture mirror to prevent collision between the aperture mirror and the back mirror.

3. The tunable MEMS Etalon system of claim 1 wherein the back layer comprises glass layer(wafer) and said back mirror includes Titanium Oxide deposited on a region of said glass layer.

4. The tunable MEMS Etalon system of claim 1 wherein said suspension structure comprises a flexure for carrying said aperture mirror; said flexure is comprises a region of said functional layer patterned in the form of a spring or a thin donut shaped membrane adapted for carrying said aperture mirror.

5. The tunable MEMS Etalon system of claim 1 wherein said one or more regions of the actuation layer include two or more regions substantially electrically insulated from one another such that application of different electric potentials between said two or more regions of the actuation layer and the functional layer allows to adjust parallelism between said aperture mirror and said back mirror.

6. The tunable MEMS Etalon system of claim 5 wherein said two or more regions include at least three regions allowing to adjust parallelism between said aperture and back mirrors about two axes.

7. The tunable MEMS Etalon system of claim 1 comprising Kelvin electrodes are located and arrange on a surface of the back layer such that applying voltage thereto causes Kelvin polarization force between the aperture mirror and the back layer or between the aperture mirror and the actuation layer located at the side of the aperture opposite to the back layer thereby enabling to adjust a distance and parallelism between the aperture mirror and said back mirror of the etalon.

8. The tunable MEMS Etalon system of claim 7 wherein the aperture mirror comprises and/or is coupled to high k dielectric material thereby increasing said Kelvin polarization force.

9. The tunable MEMS Etalon system of claim 1 comprising Piezoelectric actuation structure is coupled said suspension structure such that application of electric voltage through said piezoelectric actuation structure deforms the suspension structure thereby adjusting a distance between the aperture mirror suspended thereby and said back mirror of the etalon.

10. The tunable MEMS Etalon system of claim 1 wherein said functional layer is fabricated from Silicon on Insulator (SOI) wafer structure which includes:
   a handle layer comprising Silicon (Si) material;
   a box layer comprising insulating material; and
   a device layer comprising Silicon (Si) material.

11. The tunable MEMS Etalon system of claim 10 comprising an actuation layer located above the functional layer; and both the functional layer and said actuation layer are fabricated from said SOI wafer structure by respectively patterning the device and handle layers of the SOI and removing the insulating material of the box layer between the suspension structure of the functional layer and the actuation layer.

12. The tunable MEMS Etalon system of claim 11 wherein the functional layer is insulated from the actuation layer said box layer; said displacement between said aperture mirror and said back mirror is adjustable by applying electric potential difference between two or more regions of the actuation layer, which are substantially electrically insulated from one another by tranches patterned in said handle layer of the SOI wafer structure, and the functional layer to thereby cause said electrostatic forces between them.

13. The tunable MEMS Etalon system of claim 11 wherein said actuation layer is patterned to define an aperture window located above said aperture mirror to allow light passage through the aperture window to said aperture mirror.

14. The tunable MEMS Etalon system of claim 10 wherein said functional layer is fabricated from said SOI wafer structure by patterning the layer of the SOI; said actuation layer comprises a glass substrate having a cavity formed at a location above said aperture mirror, and wherein said one or more one or more regions of the actuation layer comprise one or more are electrodes placed in said cavity and configured with electrical connectivity for connecting to a source of electric potential.

15. The tunable MEMS Etalon system of claim 14 wherein the handle and box layers of said SOI wafer are patterned to define a side spacers for spacing between the functional layer and the back layer to serve as spacer between them.

16. The tunable MEMS Etalon system of claim 14 and wherein the handle and box layers of said SOI wafer are removed (etched/polished), and wherein the functional layer and the back layer are spaced from one another by glass spacer bonded to said back layer.

17. The tunable MEMS Etalon system of claim 10 wherein said aperture mirror is fabricated by:
   patterning a glass on substrate wafer comprising a glass layer and a carrier layer, to define said aperture mirror in the glass layer;
   attaching the patterned glass on substrate/carrier wafer to the functional layer such that said aperture mirror defined in the glass layer is attached to the suspension structure of the functional layer; and
   removing (e.g. etching/polishing) the carrier layer of the glass on substrate wafer.

18. The tunable MEMS Etalon system of claim 10 wherein said aperture mirror comprises a mirror element coupled to said suspension structure by pick and place technique.

19. The tunable MEMS Etalon system of claim 1 wherein said functional layer comprises a glass substrate patterned to accommodate said suspension structure and wherein back layer is comprises a second glass substrate attached to said glass substrate of the functional layer.

20. The tunable MEMS of claim 19 wherein said functional layer is patterned to define a peripheral frame region which is coupled to said second glass substrate by air tight sealing.

21. The tunable MEMS of claim 20, wherein said functional layer is in the form of a continuous layer patterned to have a thin membrane region enclosed within the peripheral frame region, and enclosing an aperture region defining said aperture mirror being suspended thereby, wherein said thin membrane is configured as flexure of said suspension structure for suspending the aperture mirror, and is air tight and seals a space enclosing said aperture mirror between said functional layer and said back layer.

22. The tunable MEMS Etalon system of claim 21 wherein said functional layer is coupled to the back layer such that the aperture region protrudes from the membrane region towards the back mirror; and wherein a Piezoelectric actuation structure is coupled to a surface of the membrane region at an opposite side of said protrusion such that application of electric voltage through said piezoelectric actuation structure deforms the membrane region thereby adjusting a distance between the aperture mirror suspended thereby and said back mirror of the etalon.

23. The tunable MEMS Etalon system of claim 22 wherein said functional layer is coupled to the back layer such that the aperture region protrudes from the membrane region in a direction opposite to the back layer; and wherein Kelvin electrodes are located and arrange on a surface of the back layer such that applying voltage thereto causes Kelvin polarization force between the aperture mirror and the back layer thereby adjusting a distance between the aperture mirror and said back mirror of the etalon.

24. The tunable MEMS of claim 19 wherein said functional layer comprises bending beam spring flexure coupling said peripheral frame region, and said aperture mirror; said bending beam spring flexure includes at least one of the following:
   (a) Pattered region of the glass substrate of said functional layer shaped to form said spring flexure; and
   (b) Pre-stressed polyimide coupled to said peripheral frame region.

25. The tunable MEMS Etalon system of claim 24 wherein a Piezoelectric actuation structure is coupled said spring flexure such that application of electric voltage through said piezoelectric actuation structure deforms the spring flexure thereby adjusting a distance between the aperture mirror suspended thereby and said back mirror of the etalon.

26. The tunable MEMS Etalon system of claim 24 wherein Kelvin electrodes are located and arrange on a surface of the back layer such that applying voltage thereto causes Kelvin polarization force between the aperture mirror and the back layer thereby adjusting a distance between the aperture mirror and said back mirror of the etalon.

27. The tunable MEMS Etalon of claim 24 comprising a third glass substrate serving as a cap plate and coupled to said peripheral frame region from above by an air tight sealing thereby sealing a space enclosing said aperture mirror between said cap plate and said back layer.

28. The tunable MEMS Etalon of claim 27 wherein a displacement between said aperture mirror and said back mirror is adjustable by means of electrostatic forces; and wherein said cap plate serves as actuation layer located and includes one or more electrodes located at one or more regions thereof and electrically insulated from the functional layer; said displacement between said aperture mirror and said back mirror is adjustable by applying electric potential difference between the one or more regions of the actuation layer and conductive electrode(s) associated with said spring flexure.

* * * * *